United States Patent
Jang et al.

(10) Patent No.: US 10,157,683 B2
(45) Date of Patent: Dec. 18, 2018

(54) SHIFT REGISTER USING OXIDE TRANSISTOR AND DISPLAY DEVICE USING THE SAME

(71) Applicant: LG Display Co., Ltd., Seoul (KR)

(72) Inventors: Yong-Ho Jang, Goyang-si (KR); Jong-Uk Bae, Seoul (KR)

(73) Assignee: LG Display Co., Ltd., Seoul (KR)

( * ) Notice: Subject to any disclaimer, the term of this patent is extended or adjusted under 35 U.S.C. 154(b) by 182 days.

(21) Appl. No.: 15/140,931

(22) Filed: Apr. 28, 2016

(65) Prior Publication Data
US 2016/0322116 A1  Nov. 3, 2016

(30) Foreign Application Priority Data

Apr. 29, 2015  (KR) .................. 10-2015-0060519

(51) Int. Cl.
| G11C 19/00 | (2006.01) |
| G11C 19/28 | (2006.01) |
| G09G 3/20 | (2006.01) |
| G09G 3/3266 | (2016.01) |
| G09G 3/36 | (2006.01) |
| H01L 29/786 | (2006.01) |

(52) U.S. Cl.
CPC .............. *G11C 19/28* (2013.01); *G09G 3/20* (2013.01); *G09G 3/2092* (2013.01); *G09G 3/3266* (2013.01); *G09G 3/3677* (2013.01); *G11C 19/287* (2013.01); *H01L 29/7869* (2013.01); *G09G 2310/0267* (2013.01); *G09G 2310/0286* (2013.01); *G09G 2330/028* (2013.01)

(58) Field of Classification Search
None
See application file for complete search history.

(56) References Cited

U.S. PATENT DOCUMENTS

2012/0267513 A1* 10/2012 Jeon .................... H01L 27/1446
    250/208.2
2012/0269316 A1* 10/2012 Jang .................... G09G 3/3677
    377/75

(Continued)

FOREIGN PATENT DOCUMENTS

CN    102184965 A    9/2011
CN    102253548 A    11/2011

(Continued)

OTHER PUBLICATIONS

European Search Report for European Patent Application No. EP 16164632.8, dated Aug. 19, 2016, 10 Pages.

(Continued)

*Primary Examiner* — Tuan T Lam
(74) *Attorney, Agent, or Firm* — Fenwick & West LLP

(57) ABSTRACT

Disclosed is a shift register which prevents current leakage and degradation of an oxide transistor due to light to improve output stability, and a display device using the same. The shift register includes a plurality of stages, and each stage includes a transmission line unit including a plurality of clock lines to supply a plurality of clock signals and a plurality of power lines to supply a plurality of voltages, a transistor unit including a plurality of transistors, and a light-shielding layer overlapping at least one transistor of the transistor unit so as to block light.

19 Claims, 17 Drawing Sheets

(56) References Cited

U.S. PATENT DOCUMENTS

| | | | |
|---|---|---|---|
| 2012/0298983 A1* | 11/2012 | Chang | H01L 29/78633 257/43 |
| 2013/0207087 A1 | 8/2013 | Kim et al. | |
| 2014/0044228 A1 | 2/2014 | Jang | |
| 2014/0354655 A1* | 12/2014 | Kim | G06T 1/20 345/501 |
| 2015/0029082 A1 | 1/2015 | Jeon et al. | |
| 2015/0116194 A1 | 4/2015 | Matsui et al. | |
| 2015/0187959 A1* | 7/2015 | Yoon | H01L 27/1225 257/43 |
| 2015/0317954 A1* | 11/2015 | Jang | G09G 3/20 345/213 |
| 2016/0020264 A1* | 1/2016 | Choo | H01L 29/7869 257/40 |
| 2016/0253976 A1* | 9/2016 | Jang | G09G 3/3677 345/208 |
| 2017/0004760 A1* | 1/2017 | Jang | G09G 3/2092 |
| 2017/0032733 A1* | 2/2017 | Jang | G09G 3/20 |
| 2017/0047348 A1* | 2/2017 | Abe | H01L 27/124 |

FOREIGN PATENT DOCUMENTS

| | | |
|---|---|---|
| CN | 103247659 A | 8/2013 |
| CN | 103296012 A | 9/2013 |
| EP | 2816603 | 12/2014 |

OTHER PUBLICATIONS

The State Intellectual Property Office of the People's Republic of China, First Office Action, CN Patent Application No. 201610274676.9, dated Sep. 3, 2018, 24 pages.

* cited by examiner

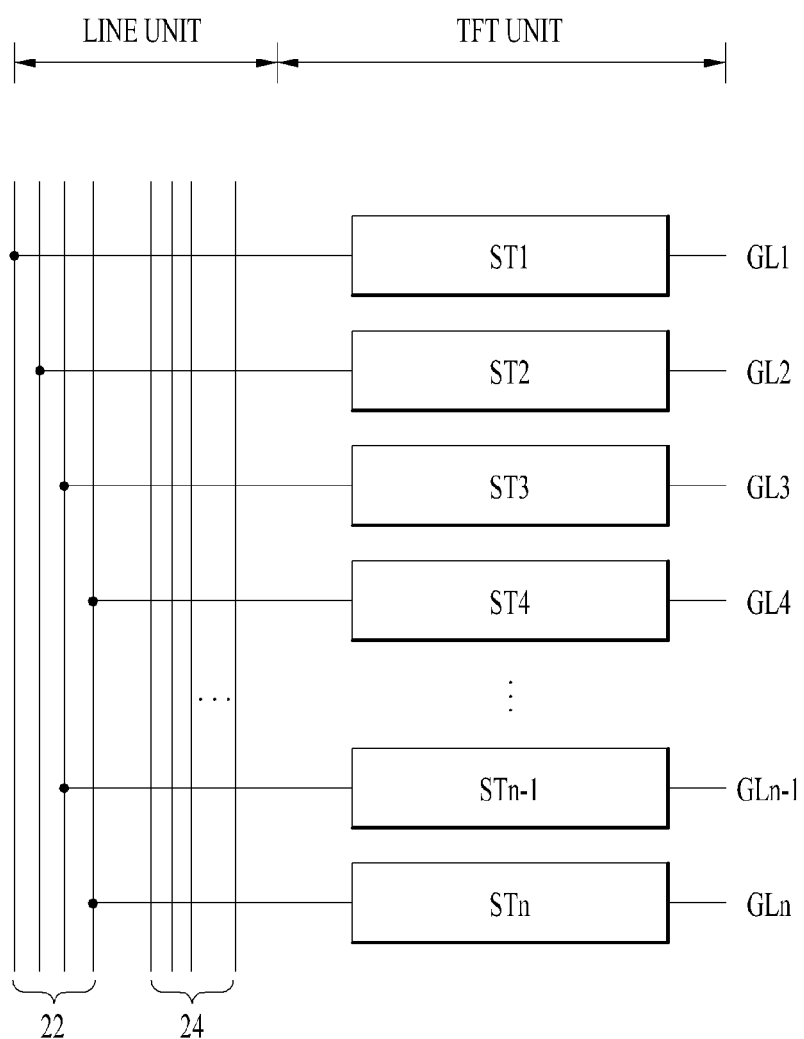

SHIFT REGISTER USING OXIDE TRANSISTOR AND DISPLAY DEVICE USING THE SAME

CROSS-REFERENCE TO RELATED APPLICATION

This application claims the benefit of Korean Patent Application No. 10-2015-0060519, filed on Apr. 29, 2015, which is hereby incorporated by reference as if fully set forth herein.

BACKGROUND

Related Field

The present invention relates to a shift register, which may prevent current leakage and degradation of an oxide transistor due to light so as to improve output stability, and a display device using the same.

Discussion of the Related Art

Examples of flat display devices include Liquid Crystal Displays (LCDs) using liquid crystal, OLED displays using Organic Light Emitting Diodes (OLEDs), Electrophoretic Displays (EPDs) using electrophoretic particles, etc.

A flat display device includes a display panel for displaying an image through a pixel array in which each pixel is independently driven by a thin film transistor (TFT), a panel driver for driving the display panel, and a timing controller for controlling the panel driver. The panel driver includes a gate driver for driving gate lines of the display panel and a data driver for driving data lines of the display panel.

The gate driver includes a shift register to output scan pulses (also referred to as scan signals) to sequentially drive the gate lines of the display panel. The shift register includes a plurality of interconnected stages, and each stage includes a plurality of transistors. Output of each stage is supplied to each gate line as a scan pulse and supplied as a carry signal for controlling charge and discharge of other stages. Recently, gate drivers mainly use a Gate-In-Panel (GIP) type which is formed together with a TFT array of a pixel array and is embedded in a panel.

Recently, as a TFT for display panels, implementing an oxide semiconductor transistor (hereinafter, referred to as an oxide transistor), which has higher mobility than an amorphous silicon transistor and is more easily applicable to a large area through a lower temperature process than a polysilicon transistor, is proposed. However, the oxide transistor has drawbacks, such as high sensitivity to light (i.e., varying characteristics when light is applied thereto).

FIG. 1 is a voltage (Vg) to current (Ids) graph illustrating variation in a threshold voltage (Vth) according to lapse of time for which light is applied to a general oxide transistor.

With reference to FIG. 1, when light is applied to an oxide active layer of the oxide transistor, threshold voltage (Vth) takes a negative value and, as time elapses, the oxide active layer is degraded due to light, and the threshold voltage (Vth) is further moved in the direction of a negative value.

When the threshold voltage (Vth) of the oxide transistor is moved in the direction of a negative value due to light, leakage current may be increased, and a circuit may be abnormally operated.

In more detail, an N-type oxide transistor is mainly implemented in a shift register and, even if gate off voltage (gate low voltage) is applied as gate voltage to logically turn off the transistor (e.g., Vgs=0V), an overdrive voltage (Vgs−Vth) may be greater than 0V, because the threshold voltage Vth can become negative due to light. Thus, leakage current can flow and the shift register may not output a normal waveform.

For example, when a threshold voltage (Vth) of the oxide transistor has a negative value due to light incident on the oxide transistor, the waveform of a scan pulse output through a pull-up transistor may be distorted or the scan pulse may not be output due to leakage current of a node controller for controlling the pull-up transistor.

SUMMARY

Accordingly, the present invention is directed to a shift register using an oxide transistor and a display device using the same that substantially obviate one or more problems due to limitations and disadvantages of the related art.

An object of the present invention is to provide a shift register, which may prevent current leakage and degradation of an oxide transistor due to light so as to increase output stability, and a display device using the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a shift register includes a plurality of stages respectively connected to a plurality of gate lines of a display panel to output respective scan signals.

In one or more embodiments, a stage of the plurality of stages includes a first node controller including a plurality of transistors configured to control charging or discharging of a first node; an output unit configured to output a clock signal as a scan signal in response to a first voltage at the first node; and a light-shielding layer on or over one or more transistors of the first node controller or at least a part of the output unit to block light.

In one or more embodiments, the light-shielding layer extends over one or more stages of the plurality of stages.

In one or more embodiments, the stage further includes a second node controller configured to control charging or discharging of a second node, the output unit further configured to output a gate off voltage as the scan signal in response to a second voltage at the second node.

In one or more embodiments, the output unit includes a scan output unit, the scan output unit comprising: a first pull-up transistor coupled to an output of the scan output unit, the first pull-up transistor configured to output the clock signal as the scan signal to a gate line of a display panel in response to the first voltage, and a first pull-down transistor coupled to the output of the scan output unit, the first pull-down transistor configured to output the gate off voltage as the scan signal to the gate line of the display panel in response to the second voltage.

In one or more embodiments, the scan output unit is configured to output the scan signal to a preceding stage or a subsequent stage.

In one or more embodiments, the output unit further includes a carry output unit, the carry output unit comprising: a second pull-up transistor coupled to an output of the carry output unit, the second pull-up transistor configured to output the clock signal as a carry signal in response to the first voltage, and a second pull-down transistor coupled to the output of the carry output unit, the second pull-down transistor configured to output another gate off voltage as the carry signal in response to the second voltage, wherein the carry signal is transmitted to a preceding stage or a subsequent stage. The other gate off voltage may be lower than the gate off voltage.

In one or more embodiments, the second node controller includes an inverter coupled between the first node and the second node, the inverter configured to place the second node at a logic state opposite to a logic state of the first node. The first node controller includes a first transistor coupled to the first node, the first transistor configured to charge the first node with a set voltage in response to a first signal applied to a first control terminal of the first transistor, a second transistor coupled to the first node, the second transistor configured to discharge the first node in response to a second signal applied to a second control terminal of the second transistor, and a third transistor coupled to the first node, the third transistor configured to discharge the first node in response to the logic state of the second node.

In one or more embodiments, the first signal applied to the first control terminal of the first transistor is one of a start pulse, a previous scan signal, a carry signal, and an output from a previous stage. In one or more embodiments, the second signal applied to the second control terminal of the second transistor is one of a reset pulse, a next scan signal, the carry signal, and an output from a subsequent stage. In one or more embodiments, the set voltage is one of a supply voltage, the previous scan signal, and the carry signal.

In one or more embodiments, the inverter includes a first inverter supply voltage terminal, a second inverter supply voltage terminal, a voltage of the second inverter supply voltage terminal lower than a voltage of the first inverter supply voltage terminal, a first inverter pull up transistor, a gate electrode and a drain electrode of the first inverter pull up transistor coupled to the first inverter supply voltage terminal, a source electrode of the first inverter pull up transistor coupled to the second node, and a first inverter pull down transistor, a gate electrode of the first inverter pull down transistor coupled to the first node, a source electrode of the first inverter pull down transistor coupled to the second inverter supply voltage terminal, a drain electrode of the first inverter pull down transistor coupled to the second node.

In one or more embodiments, the inverter includes a first inverter supply voltage terminal, a second inverter supply voltage terminal, a voltage of the second inverter supply voltage terminal lower than a voltage of the first inverter supply voltage terminal, a first inverter pull up transistor, a gate electrode and a drain electrode of the first inverter pull up transistor coupled to the first inverter supply voltage terminal, a second inverter pull up transistor, a gate electrode of the second inverter pull up transistor coupled to a source electrode of the first inverter pull up transistor, a drain electrode of the second inverter pull up transistor coupled to the first inverter supply voltage terminal, a source electrode of the second inverter pull up transistor coupled to the second node, a first inverter pull down transistor, a gate electrode of the first inverter pull down transistor coupled to the first node, a source electrode of the first inverter pull down transistor coupled to the second inverter supply voltage terminal, a drain electrode of the first inverter pull down transistor coupled to the source electrode of the first inverter pull up transistor and the gate electrode of the second inverter pull up transistor, and a second inverter pull down transistor, a gate electrode of the second inverter pull down transistor coupled to the first node, a source electrode of the second inverter pull down transistor coupled to the second inverter supply voltage terminal, a drain electrode of the second inverter pull down transistor coupled to the source electrode of the second inverter pull up transistor and the second node. A voltage of the second inverter supply voltage terminal may be lower than the gate off voltage.

In one or more embodiments, the first node controller includes a fourth transistor coupled in series with the third transistor between the first node and a supply terminal of a reset voltage, a gate electrode of the fourth transistor coupled to the second node, the third transistor and the fourth transistor to discharge the first node by the reset voltage according to the logic state of the second node, and a fifth transistor configured to supply an offset voltage to a connection node between the third transistor and the fourth transistor according to the logic state of the first node, the offset voltage applied to the connection node through the fifth transistor higher than a voltage of the second node to turn off the third transistor responsive to the logic state of the first node to turn on the fifth transistor.

In one or more embodiments, the light-shielding layer is on or over one or more transistors of the first node controller for discharging the first node and another transistor of the output unit for discharging another node of the output unit.

In one or more embodiments, the stage further includes another light-shielding layer on or above one or more additional transistors of the first node controller for charging the first node, and another transistor of the output unit for charging said another node of the output unit. The light-shielding layer and the other light-shielding layer may be applied with different voltages.

In one or more embodiments, the one or more transistors of the first node controller or the at least the part of the output unit include an active layer formed of an oxide semiconductor.

In another aspect of the present invention, a display device drives gate lines of a display panel using the shift register.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 3 is a block diagram schematically illustrating a shift register used as a gate driver shown in FIG. 2;

DETAILED DESCRIPTION

Reference will now be made in detail to the preferred embodiments of the present invention, examples of which are illustrated in the accompanying drawings. Wherever possible, the same reference numbers will be used throughout the drawings to refer to the same or like parts. In the following description of the present invention, a detailed description of known functions and configurations incorporated herein will be omitted when it may make the subject matter of the present invention rather unclear.

Figure 1:
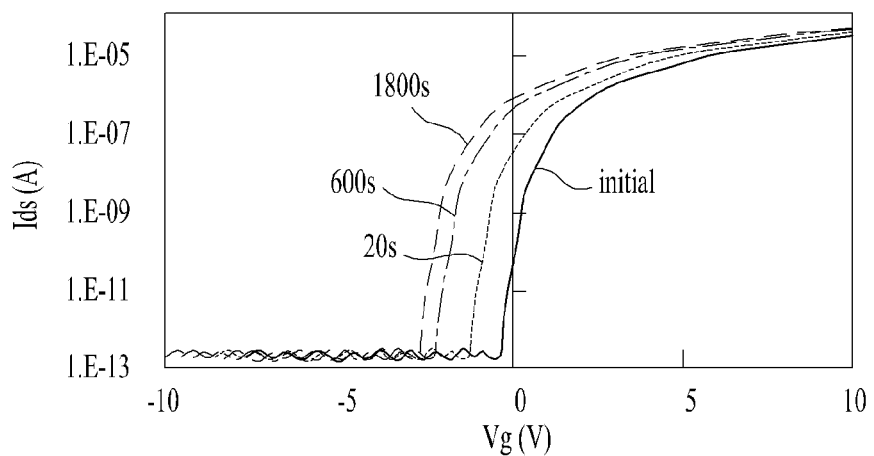
FIG. 1 is a graph illustrating variation in the threshold voltage of a general oxide transistor due to light.
Figure 2:
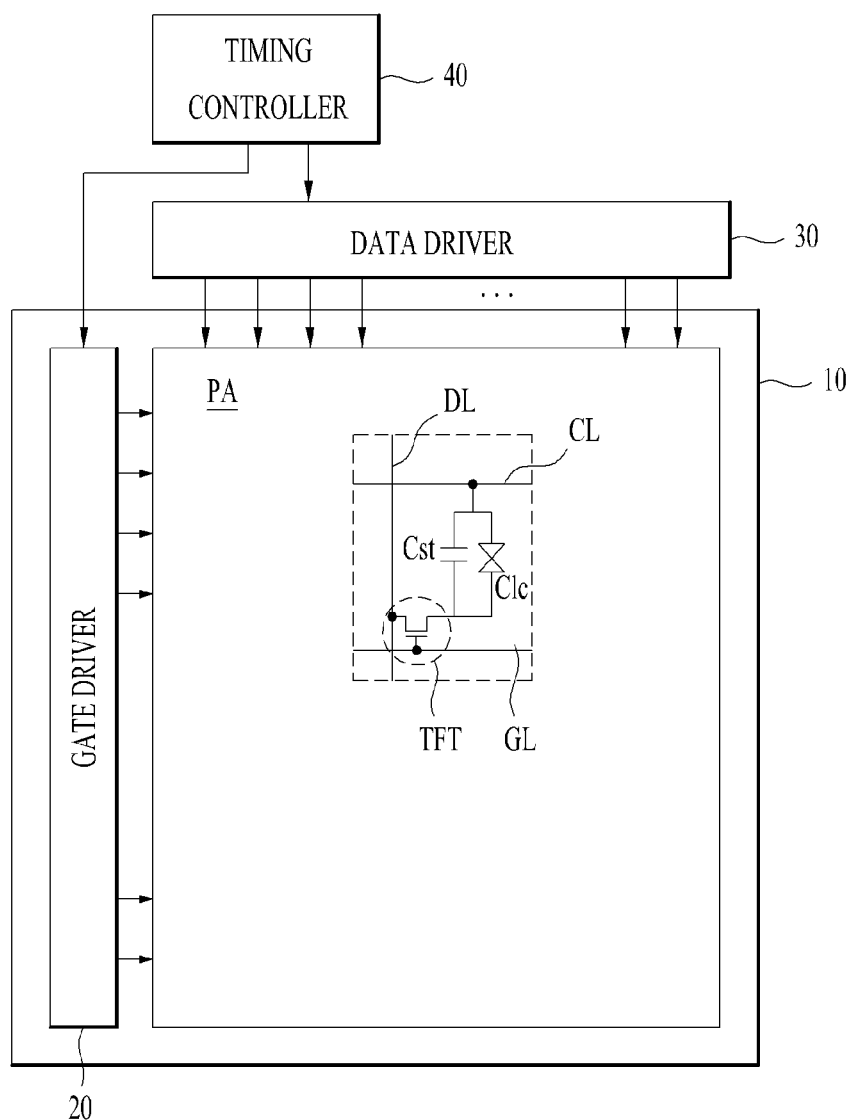
FIG. 2 is a block diagram schematically illustrating a display device in accordance with one embodiment of the present invention.

FIG. 2 is a block diagram schematically illustrating a display device in accordance with one embodiment of the present invention.

The display device shown in FIG. 2 includes a display panel 10 including a pixel array PA and a gate driver 20, a data driver 30, and a timing controller 40.

The display panel 10 displays an image through the pixel array PA arranged as a matrix. Each of pixels of the pixel array PA produces a desired color through combination of red (R), green (G) and blue (B) sub-pixels and may additionally include a white (W) sub-pixel for enhancing brightness. Each sub-pixel is independently driven by a thin film transistor.

A liquid crystal display (LCD), an organic light emitting diode (OLED), or an electrophoretic display (EPD) may be used as the display panel 10. Hereinafter, the display panel 10 employing an LCD will be exemplarily illustrated.

If the LCD is used as the display panel 10, each sub-pixel of the pixel array PA includes a thin film transistor TFT connected to a gate line GL and a data line DL, and a liquid crystal capacitor Clc and a storage capacitor Cst connected in parallel between the thin film transistor TFT and a common line CL. The liquid crystal capacitor Clc is charged with a differential voltage between a data signal supplied to a pixel electrode through the thin film transistor TFT and common voltage supplied to a common electrode through the common line CL and drives liquid crystals according to the charged voltage, thus controlling optical transmittance. The storage capacitor Cst stably maintains the voltage charging the liquid crystal capacitor Clc. A liquid crystal layer is driven by a vertical field, as in a twisted nematic (TN) mode or a vertical alignment (VA) mode, or driven by a horizontal field, as in an in-plane switching (IPS) mode or a fringe field switching (FFS) mode.

The gate driver 20 is of a Gate-In-Panel (GIP) type embedded in a non-display region of the display panel 10, and includes a plurality of oxide transistors formed together with a TFT array of the pixel array PA on a substrate. Particularly, the gate driver 20 may include a light-shielding layer formed at some parts of the region of a transistor unit including the oxide transistors to prevent current leakage and degradation due to light, thereby increasing output stability.

The embedded gate driver 20 includes a shift register shown in FIG. 2 and drives the gate lines GL of the pixel array PA sequentially or through an interlacing method in response to a gate control signal from the timing controller 40. The gate driver 20 supplies a scan pulse of gate on voltage (e.g., gate high voltage) for a scan time of each gate line GL so as to enable the gate line GL, and supplies gate off voltage (e.g., gate low voltage) for the remaining time so as to disable the gate line GL. The embedded gate driver 20 may be formed on one side or both sides of the pixel array PA.

A level shifter (not shown) may be additionally provided between the timing controller 40 and the gate driver 20. The level shifter performs level shifting from gate control signals from the timing controller 40, i.e., a start pulse and transistor-transistor logic (TTL) voltages of a plurality of clocks, to gate high voltage (Vgh) and gate low voltage (Vgl) for driving the TFTs of the display panel 10 and then supplies the gate high voltage (Vgh) and the gate low voltage (Vgl) to the shift register of the gate driver 20.

The data driver 30 supplies image data from the timing controller 40 to a plurality of data lines DL of the display panel 10 in response to a data control signal from the timing controller 40. The data driver 30 converts data from the timing controller 40 into an analog data signal using gamma voltage from a gamma voltage generator (not shown), and supplies the data signal to the data lines DL whenever each gate line GL is driven. The data driver 30 may include at least one data IC, be mounted on a circuit film, such as a tape carrier package (TCP), a chip on film (COF), or a flexible printed circuit (FPC), and attached to a liquid crystal panel 100 by tape automatic bonding (TAB), or be mounted on the display panel 10 by a chip on glass (COG) method.

The timing controller 40 receives a plurality of synchronization signals together with image data supplied from an external host set. The synchronization signals may include a dot clock and a data enable signal and further include a horizontal synchronization signal and a vertical synchronization signal. In order to enhance image quality or to reduce power consumption, the timing controller 40 corrects the data received from the host set using various data processing methods and then outputs the corrected data to the data driver 30.

The timing controller 40 generates data control signals for controlling the timing of driving of the data driver 30 and gate control signals for controlling the timing of driving of the gate driver 20 using the synchronization signals. The data control signals include a source start pulse and source clocks for controlling the latch of a data signal, a polarity control signal for controlling the polarity of the data signal, and a source output enable signal for controlling the output period of the data signal. The gate control signals include a gate start pulse and gate clocks for controlling generation of a scan pulse and a gate output enable signal for controlling the output period of the scan pulse.

FIG. 3 is a block diagram schematically illustrating the shift register used as the gate driver shown in FIG. 2.

The shift register shown in FIG. 3 includes a transistor (TFT) unit including a plurality of stages ST1 to STn to respectively drive a plurality of gate lines GL1 to GLn, and a line unit including a plurality of clock lines 22 to supply a plurality of clock signals and a plurality of power lines 24 to supply a plurality of voltages.

The clock signals having phase differences therebetween are supplied to the shift register through the respective clock lines 22. The clock signals are alternately supplied so that at least one clock signal is supplied to each stage.

Each of the stages ST1 to STn is set in response to control of previous output (also referred to as a previous scan signal) from any one of the previous stages or a start pulse, and is reset in response to control of next output (also referred to as a next scan signal) from any one of the next stages or a reset pulse.

Each of the stages ST1 to Stn included in the transistor (TFT) unit includes a plurality of oxide transistors. In order to prevent degradation of an active layer due to light, the transistor (TFT) unit includes a light-shielding layer which overlaps at least a part of the region of each stage, i.e., some of the transistors of each stage, to prevent light from being introduced into the active layer.

Figure 4A:
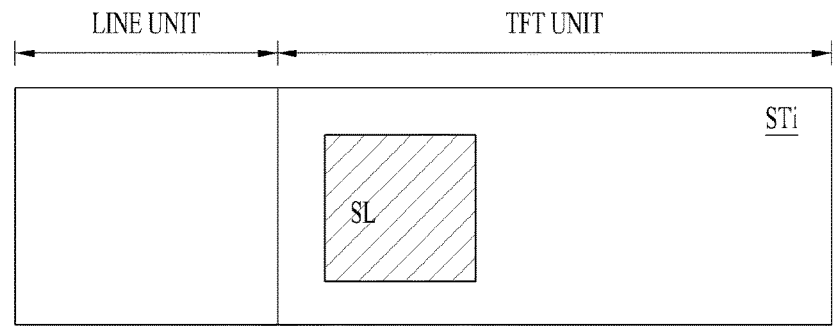
FIGS. 4A to 4C are views exemplarily illustrating regions in which a light-shielding layer is formed on one stage shown in FIG. 3.
Figure 4B:
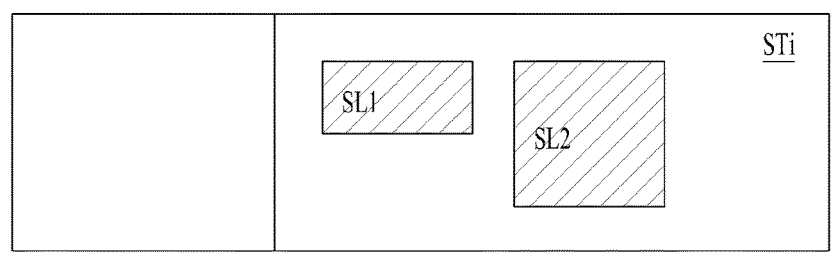
Figure 4C:
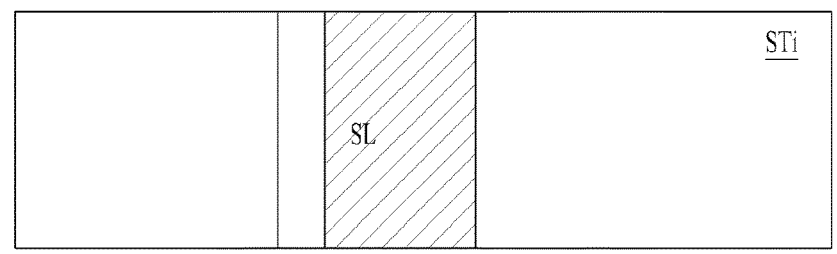

FIGS. 4A to 4C are views exemplarily illustrating regions in which the light-shielding layer is formed on one stage shown in FIG. 3.

With reference to FIGS. 4A, 4B and 4C, at least one light-shielding layer SL or SL1/SL2 having a designated region is formed at the transistor (TFT) unit of one stage STi. The light-shielding layer SL or SL1/SL2 may be located above or below the transistors and extend to the transistor (TFT) unit of another stage. Channel regions of the transistors overlapping the light-shielding layer SL or SL1/SL2 are included in the region of the light-shielding layer SL or SL1/SL2 so as not to be exposed to the light.

Voltage may be applied to the light-shielding layer SL or SL1/SL2. The light-shielding layer SL or SL1/SL2 of each stage STi may be connected to at least one power line, connected to at least one clock line, connected to an output line, or connected to a source electrode, a drain electrode or a gate electrode of at least one transistor of the transistors, and may receive a corresponding voltage. In an example shown in FIG. 4B, voltages applied to different light-shielding layers SL1 and SL2 formed on one stage STi may be the same or different. In order to apply voltages to the light-shielding layers SL1 and SL2, the light-shielding layers SL1 and SL2 may be connected to wiring of the shift register, electrodes of the transistors or extension lines thereof through bridge electrodes (connection electrodes).

Figure 5A:
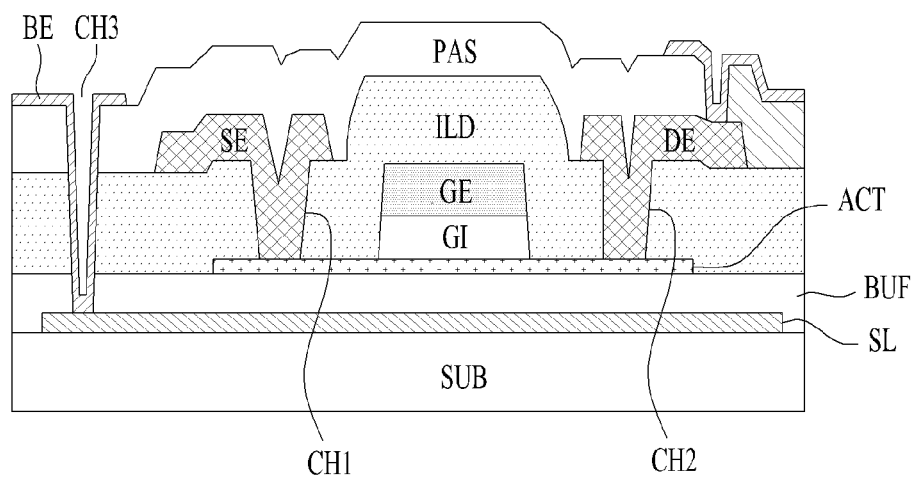
FIGS. 5A and 5B are a cross-sectional view and an equivalent circuit diagram illustrating an oxide transistor in accordance with one embodiment of the present invention.
Figure 5B:
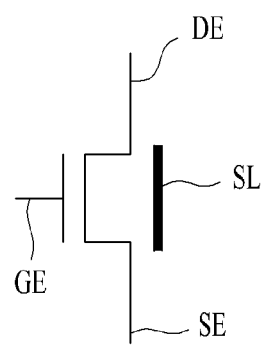

FIGS. 5A and 5B are a cross-sectional view and an equivalent circuit diagram illustrating an oxide transistor, respectively, in accordance with one embodiment.

The oxide transistor shown in FIG. 5A includes a light-shielding layer SL on a substrate SUB, a buffer layer BUF covering the light-shielding layer SL on the substrate SUB, an active layer ACT on the buffer layer BUF, a gate insulating layer GI and a gate electrode GE stacked on the active layer ACT, an interlayer dielectric film ILD covering the gate electrode GE, the gate insulating film GI and the active layer ACT on the buffer layer BUF, a source electrode SE and a drain electrode DE located on the interlayer dielectric film ILD and connected to the active layer ACT through contact holes CH1 and CH2 formed through the interlayer dielectric film ILD, and a passivation layer PAS covering the source electrode SE and the drain electrode DE on the interlayer dielectric film ILD.

The light-shielding layer SL blocks light incident from the outside of the substrate SUB and prevents the light from being introduced into the active layer ACT formed of an oxide semiconductor. For this purpose, the light-shielding layer SL has a greater area than the active layer ACT so that the active layer ACT is covered by the light-shielding layer SL. In one embodiment, the light-shielding layer SL is an opaque thin film having a designated conductivity and formed of a metal or a semiconductor.

Alternatively, the light-shielding layer SL may be located above the oxide transistor, i.e., on the passivation layer PAS.

The oxide transistor, as exemplarily shown in FIG. 5B, may be expressed as an equivalent circuit including a gate electrode GE, a source electrode SE, a drain electrode DE, and a light-shielding layer SL provided in parallel with a channel between the source electrode SE and the drain electrode DE and facing the gate electrode GE.

Hereinafter, the oxide transistor including the light-shielding layer SL, as exemplarily shown in FIG. 5B, may be abbreviated as a light-shielding transistor.

In order to apply a specific voltage to the light-shielding layer SL, the oxide transistor, as exemplarily shown in FIG. 5A, may further include a contact hole CH3 formed through the passivation layer PAS, the interlayer dielectric film ILD and the buffer layer BUF, and a bridge electrode BE (or a connection electrode) located on the passivation layer PAS and connected to the light-shielding layer SL through the contact hole CH3. The bridge electrode BE is connected to the wiring of the shift register, the electrode of the TFT or the extension line thereof.

Figure 6:
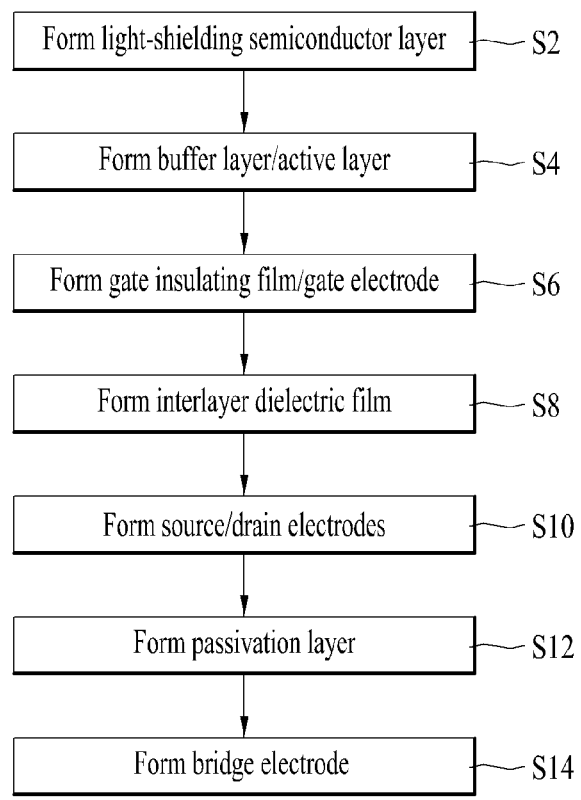
FIG. 6 is a flowchart sequentially illustrating a manufacturing method of the oxide transistor shown in FIG. 5 A.

FIG. 6 is a flowchart sequentially illustrating a manufacturing method of the oxide transistor shown in FIG. 5A. Hereinafter, the manufacturing method of the oxide transistor shown in FIG. 6 will be described with reference to FIG. 5A.

Through a first masking process, the light-shielding layer SL is formed on the substrate SUB (Operation S2).

The light-shielding layer SL is an opaque thin film having a designated conductivity and formed of a metal or a semiconductor. As the semiconductor, any one semiconductor material of silicon (Si), germanium (Ge) and silicon-germanium (SiGe), which are dielectric materials having similar electric conductivities and optical absorption coefficients, may be used. If a semiconductor is used, the light-shielding layer SL may be formed of a semiconductor material including germanium (Ge) having a high shading rate. The light-shielding layer SL prevents light from being introduced into the active layer ACT formed of an oxide semiconductor by absorbing external light or internal light. After formation of the light-shielding layer SL on the substrate SUB, the light-shielding layer SL is patterned so as to remain in a designated region by performing photolithography and etching using a first mask.

Through a second masking process, the buffer layer BUF is formed on the substrate SUB so as to cover the light-shielding layer SL, and the active layer is formed on the buffer layer BUF (Operation S4).

The buffer layer BUF is formed on the substrate SUB provided with the light-shielding layer SL formed thereon. The buffer layer BUF serves to protect the active layer ACT formed through a subsequent process from impurities, such as alkali ions leaking from the substrate SUB. The buffer layer BUF is formed of an insulating material which selectively uses silicon oxide ($SiO_2$) and silicon nitride ($SiN_x$).

Thereafter, after formation of an oxide semiconductor layer on the buffer layer BUF, the oxide semiconductor layer is patterned so as to form the active layer ACT overlapping the light-shielding layer SL by performing photolithography and etching using a second mask. The oxide semiconductor layer may be formed through sputtering using an amorphous zinc oxide composite semiconductor, particularly an a-IGZO semiconductor which is a composite target of gallium oxide ($Ga_2O_3$), indium oxide ($In_2O_3$) and zinc oxide (ZnO), or through chemical deposition. Prior to patterning of the oxide semiconductor layer, heat treatment may be further performed through a dehydration process for removing hydrogen ($H_2$ and H) or hydroxyl ions ($OH^-$).

Through a third masking process, the gate insulating film GI and the gate electrode GE may be formed as a stack structure on the active layer ACT (Operation S6).

After sequential formation of the gate insulating film GI and a gate metal layer on the active layer ACT, the gate insulating film GI and the gate metal layer are patterned so as to form the gate electrode GE and the gate insulating film GI having the same pattern as the gate electrode GE by performing photolithography and etching using a third mask. The gate insulating film GI selectively uses silicon oxide ($SiO_2$) and silicon nitride ($SiN_x$). As the gate metal layer, one, selected from the group consisting of copper (Cu), molybdenum (Mo), aluminum (Al), chrome (Cr), gold (Au), titanium (Ti), nickel (Ni), neodymium (Nd), tantalum (Ta) and tungsten (W), or a multi-layer stack structure, formed of metals selected from the group and/or alloys thereof, may be used.

Through a fourth masking process, the interlayer dielectric layer ILD, covering the gate electrode GE, the gate insulating film Gi and the active layer ACT, is formed on the buffer layer BUF and the contact holes CH1 and CH2 are formed through the interlayer dielectric layer ILD (Operation S8).

After formation of the interlayer dielectric film ILD on the buffer layer BUF so as to cover the gate electrode GE, the gate insulating film GI and the active layer ACT, the contact holes CH1 and CH2 for respectively exposing a source region and a drain region of the active layer ACT are formed by performing lithography and etching using a fourth mask. The interlayer dielectric film ILD is formed of silicon oxide ($SiO_2$), silicon nitride ($SiN_x$) or a stack structure thereof.

Through a fifth masking process, the source electrode SE and the drain electrode DE are formed on the interlayer dielectric film ILD (Operation S10).

After formation of a source/drain metal layer on the interlayer dielectric film ILD, the source/drain metal layer is patterned so as to form the source electrode SE and the drain electrode DE by performing photolithography and etching using a fifth mask. The source electrode SE is connected to the source region of the active layer ACT through the first contact hole CH1 and the drain electrode DE is connected to the drain region of the active layer ACT through the second contact hole CH2. The source/drain metal layer may be formed of any one selected from the group consisting of copper (Cu), molybdenum (Mo), aluminum (Al), chrome (Cr), gold (Au), titanium (Ti), nickel (Ni) and neodymium (Nd), or an alloy thereof.

Through a sixth masking process, the passivation layer PAS covering the source electrode SE and the drain electrode DE is formed on the interlayer dielectric film ILD, and the contact hole CH3 is formed (Operation S12).

After formation of the passivation layer PAS on the interlayer dielectric film ILD so as to cover the source electrode SE and the drain electrode DE, the contact hole CH3 is formed by performing photolithography and etching using a sixth mask. The contact hole CH3 is formed through the passivation layer PAS, the interlayer dielectric film ILD and the buffer layer BUF and exposes a connection region of the light-shielding layer SL. Here, a contact hole (not shown) through the passivation layer PAS so as to expose the source electrode SE or the drain electrode DE or a contact hole (not shown) through the passivation layer PAS and the interlayer dielectric film ILD so as to expose the gate electrode GE are further formed. The passivation layer PAS is formed of silicon oxide ($SiO_2$), silicon nitride ($SiN_x$) or a stack structure thereof.

Through a seventh masking process, the bridge electrode BE is formed on the passivation layer PAS (Operation S14).

The bridge electrode BE is formed by forming a transparent conductive layer formed of indium tin oxide (ITO) or indium zinc oxide (IZO) on the passivation layer PAS and then patterning the transparent conductive layer by performing photolithography and etching using a seventh mask. The bridge electrode BE may be formed simultaneously with pixel electrodes of the respective pixels of the pixel array PA (in FIG. 2), and be connected to the light-shielding layer SL through the contact hole CH3 and connected to the gate electrode GE, the source electrode SE, the drain electrode DE and other wirings (the power line, clock line, output line, node, etc.) through other contact holes (not shown).

Figure 7:
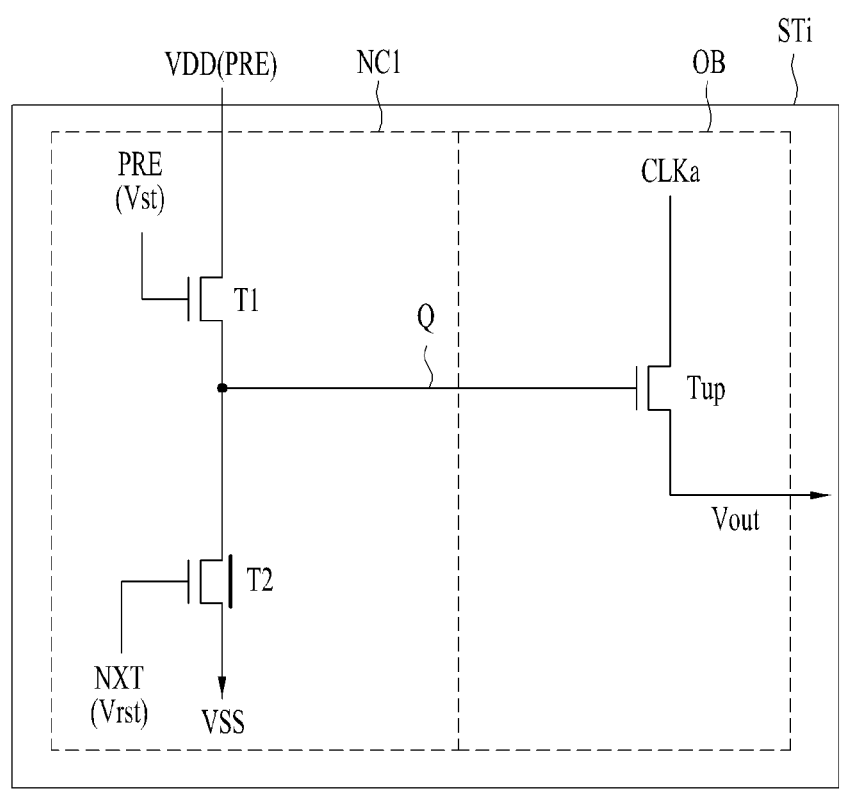
FIG. 7 is a circuit diagram illustrating one stage of a shift register in accordance with one embodiment of the present invention.

FIG. 7 is a circuit diagram illustrating any one stage of a shift register in accordance with one embodiment of the present invention.

Any one stage STi of the shift register shown in FIG. 7 includes an output unit OB to supply output voltage Vout in response to the logic state of a first node Q, and a first node controller NC1 to control charge and discharge of the first node Q.

The output unit OB includes a pull-up transistor Tup to supply a clock signal CLKa as output voltage Vout in response to control of the first node Q. The output voltage Vout is supplied to a corresponding gate line as a scan pulse and is supplied as a carry signal for controlling charge and discharge of other stages. For example, the carry signal of a stage can be applied as a previous output PRE to a subsequent stage of the stage, and as a next output NXT to a preceding stage of the stage as described below.

The first node controller NC1 includes a first transistor T1 of a set part to charge the first node Q with high voltage VDD or previous output PRE in response to previous output PRE from a previous stage (preceding stage), and a second transistor T2 of a reset part to discharge the first node Q by low voltage VSS, i.e., reset voltage, in response to next output NXT from a next stage (or subsequent stage). If the corresponding stage STi is the first stage ST, a start pulse Vst is supplied instead of the previous output PRE. If the corresponding stage STi is the final stage, a reset pulse Vrst is supplied instead of the next output NXT.

After the first node Q is preliminarily charged by the first transistor T1 turned on in response to the previous output PRE from the previous stage or the start pulse Vst for a first period, the first node Q is floated in the charged state by turning off the first transistor T1 and the second transistor T2 for a second period. Here, gate on voltage (gate high voltage) of the clock signal CLKa is supplied to the drain electrode of the pull-up transistor Tup, voltage of the first node Q is amplified by a capacitor (not shown) between the gate electrode and the source electrode of the pull-up transistor Tup. Thus, the pull-up transistor Tup is stably turned on and outputs the gate on voltage of the clock signal CLKa as output voltage Vout.

Thereafter, the pull-up transistor Tup maintaining the turned-on state by floating of the first node Q outputs gate off voltage (gate low voltage) of the clock signal CLKa as output voltage Vout for a third period.

Thereafter, the first node Q is discharged by the second transistor T2 turned on in response to the next output NXT from the next stage or a reset pulse Vrst. Thus, the pull-up transistor Tup is turned off, and the output voltage Vout maintains the gate off voltage.

The stage STi of the shift register shown in FIG. 7 includes a light-shielding layer overlapping at least one of the transistors T1, T2 and Tup so as to block light. That is to say, at least one of the transistors T1, T2 and Tup of the stage STi is formed as a light-shielding transistor shown in FIGS. 8A and 8B.

For example, among the transistors T1, T2 and Tup of FIG. 7, the second transistor T2 to control discharge of the first node Q may be formed as a light-shielding transistor. The reason for this is that, according to circuit analysis, leakage current of the second transistor T2 greatly influences an output waveform. That is, when current leakage and degradation of the second transistor T2 is generated due to light, the first node Q is discharged, the pull-up transistor Tup is in an unstable turned-on state or is turned off. Thus, an output error may be generated. Therefore, if at least the second transistor T2 of one stage STi is formed as a light-shielding transistor so as to prevent current leakage and degradation of the second transistor T2, unnecessary discharge of the first node Q may be prevented and output stability may be improved.

Figure 8A:
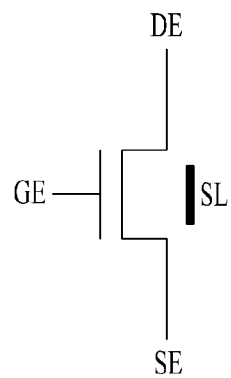
FIGS. 8A and 8B are circuit diagrams illustrating various examples of a light-shielding transistor shown in FIG. 7.
Figure 8B:
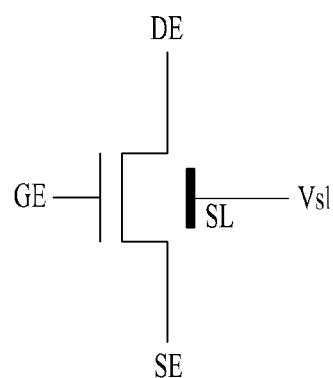

With reference to FIGS. 8A and 8B, the light-shielding transistor may be configured such that a light-shielding layer SL is floated, as exemplarily shown in FIG. 8A, or a designated voltage Vsl is applied to a light-shielding layer SL, as exemplarily shown in FIG. 8B. When designated voltage Vsl is applied to the light-shielding layer SL, threshold voltage Vth may be moved in the direction of a positive value due to field effects and, as a result, leakage current may be further prevented and output stability may be further improved. The specific voltage Vsl applied to the light-shielding layer SL may be one of a plurality of power voltages applied to the stage STi or be voltage applied to one electrode (node) of a plurality of transistors.

Figure 9:
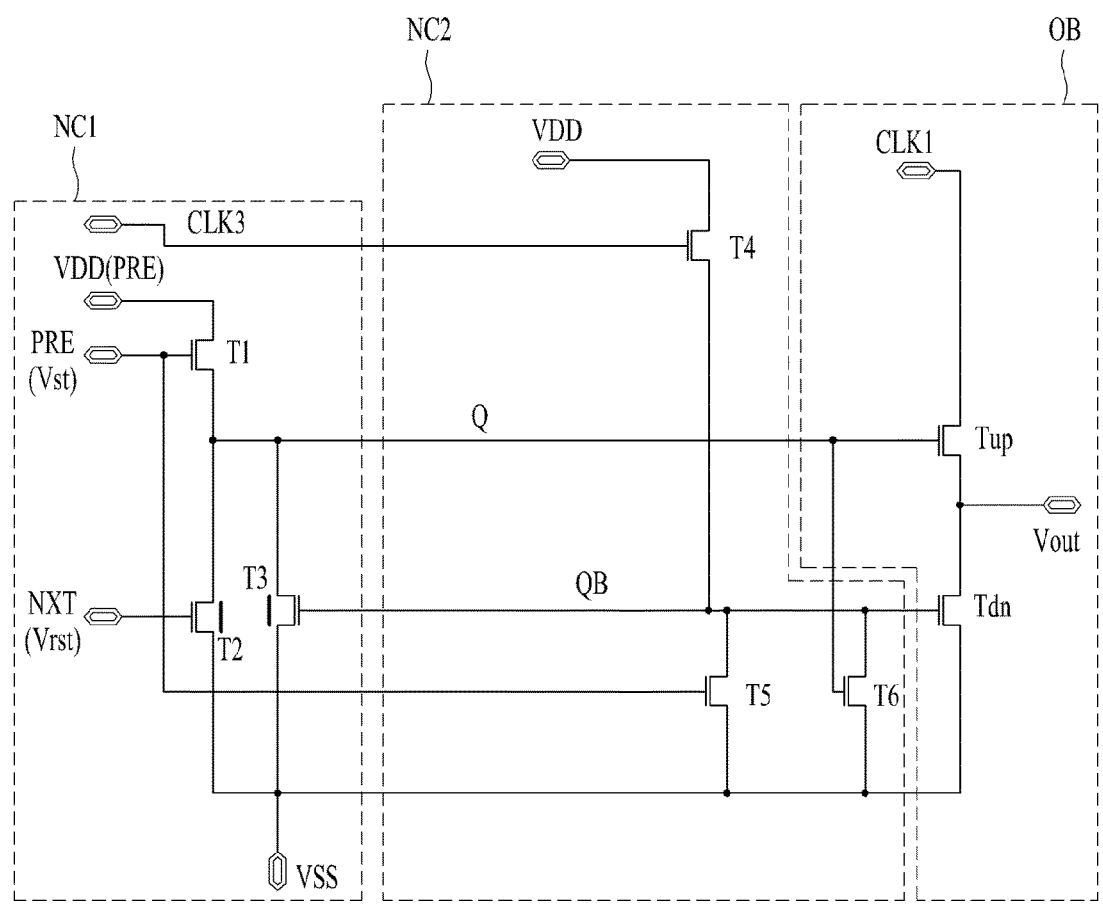
FIG. 9 is a circuit diagram illustrating one stage of a shift register in accordance with another embodiment of the present invention.

FIG. 9 is a circuit diagram illustrating any one stage of a shift register in accordance with another embodiment of the present invention.

As compared to the embodiment shown in FIG. 7, in the embodiment shown in FIG. 9, an output unit OB additionally includes a pull-down transistor Tdn controlled by a second node QB, and the first node controller NC1 additionally includes a third transistor T3 of a noise cleaner controlled by the second node QB. In addition, the stage shown in FIG. 9 includes a second node controller NC2 to control the second node QB. In one embodiment, the clock CLK1 is applied as a clock CLKa of FIG. 7. The clock CLK3 may be applied as a clock CLKa of a two subsequent stages after the stage shown in FIG. 7.

The pull-down transistor Tdn added to the output unit OB supplies low voltage VSS, i.e., gate off voltage, as output voltage Vout in response to control of the second node QB.

The third transistor T3 of the noise cleaner added to the first node controller NC1 is connected in parallel to a second transistor T2 between a first node Q and a supply line of the low voltage VSS, i.e., reset voltage. The third transistor T3 discharges the first node Q by the low voltage VSS in response to control of the second node QB. Thereby, the third transistor T3 removes noise induced to the first node Q by coupling of the clock CLK1 supplied to the pull-up transistor Tup, when the first node Q is logically low.

The second node controller NC2 includes a fourth transistor T4 for charging the second node QB with high voltage VDD in response to a third clock signal CLK3, a fifth transistor T5 for discharging the second node QB by low voltage VSS in response to a previous carry signal PRE, and a sixth transistor T6 for discharging the second node QB by low voltage VSS in response to control of the first node Q.

Alternatively, the fourth transistor T4 of the second node controller NC2 may be configured to operate as a diode by connecting a drain electrode and a gate electrode of the fourth transistor T4 to a supply line of high voltage VDD.

At least one of the transistors T1 to T6, Tup and Tdn shown in FIG. 9 is formed as a light-shielding transistor additionally including a light-shielding layer.

For example, among the transistors T1 to T6, Tup and Tdn shown in FIG. 9, at least the second and third transistors T2 and T3 for controlling discharge of the first node Q are formed as light-shielding transistors. The reason for this is that, when current leakage and degradation of the second and third transistors T2 and T3 induced due to light, the first node Q is discharged. The pull-up transistor Tup is in an unstable turned-on state or is turned off. Thus, an output error can be generated. Therefore, if at least the second and third transistors T2 and T3 of one stage STi are formed as light-shielding transistors so as to prevent current leakage and degradation of the second and third transistors T2 and T3, unnecessary discharge of the first node Q may be prevented and output stability may be improved. In addition, the first transistor T1 may be formed as a light-shielding transistor.

Figure 10:
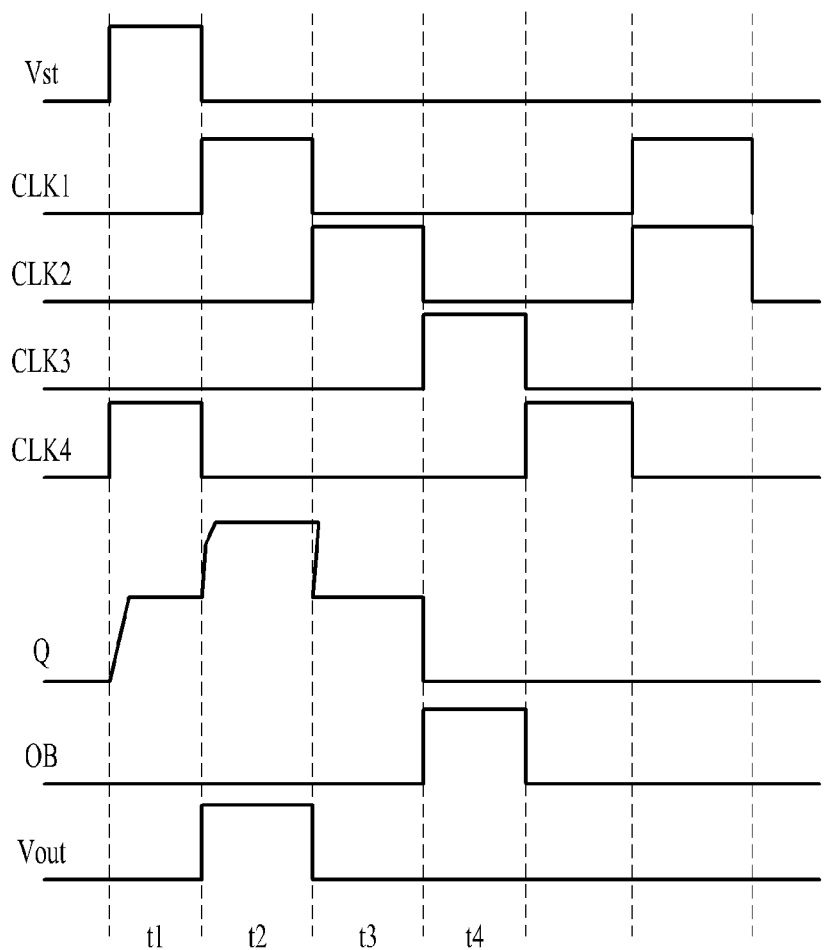
FIG. 10 is a view illustrating a driving waveform of the stage shown in FIG. 9.

FIG. 10 is a view illustrating a driving waveform of the stage shown in FIG. 9.

Hereinafter, with reference to FIG. 10, driving of the stage shown in FIG. 9 will be described in detail. The transistors which are not described otherwise for the respective periods are in the turned-off state. Assuming for an example the stage shown in FIG. 9 is a first stage, the clock CLK2 is applied instead of the clock CLK1 in a second stage, and the clock CLK4 is applied instead of the clock CLK3 in the second stage subsequent to the first stage.

For a first period t1, the first node Q is preliminarily charged by the first transistor T1 turned on in response to previous output PRE or a start pulse Vst, and the second node QB maintains a discharged state by the fifth transistor T5 turned on in response to the previous output PRE or the start pulse Vst. The output voltage Vout may be in a gate off voltage (gate low voltage or VSS), because the first clock signal CLK1 has a low voltage and the pull up transistor Tup is turned off.

For a second period t2, the first node Q is floated in the charged state by turning of the first transistor T1. Here, gate on voltage (gate high voltage) of a first clock signal CLK1 is supplied to the drain electrode of the pull-up transistor Tup, voltage of the first node Q is amplified by a capacitor (not shown) between the gate electrode and the source electrode of the pull-up transistor Tup. Thus, the pull-up transistor Tup is stably turned on and outputs the gate on voltage of the first clock signal CLK1 as output voltage Vout. Here, the sixth transistor T6 is turned on by control of the first node Q and maintains the discharged state of the second node QB2.

For a third period t3, the first clock signal CLK1 has a gate off voltage (VSS). The pull-up transistor Tup maintaining the turned-on state by floating of the first node Q outputs gate off voltage of the clock signal CLKa as output voltage Vout.

For a fourth period t4, the first node Q is discharged by the second transistor T2 turned on in response to next output NXT or a reset pulse Vrst. The next output NXT or the reset pulse Vrst may be synchronized with the clock CLK3. Thus, the pull-up transistor Tup is turned off. In addition, the sixth transistor T6 is turned off by control of the first node Q. Thus, the second node QB is charged through the fourth transistor T4 turned on by a third clock signal CLK3 or high voltage VDD. Therefore, the pull-down transistor Tdn is turned on by control of the charged second node QB and outputs low voltage VSS, i.e., gate off voltage, as output voltage Vout.

Unnecessary discharge of the first node Q for the second and third periods t2 and t3 may be prevented by the second and third transistors T2 and T3 formed as light-shielding transistors, thereby increasing stability of output voltage Vout.

Figure 11:
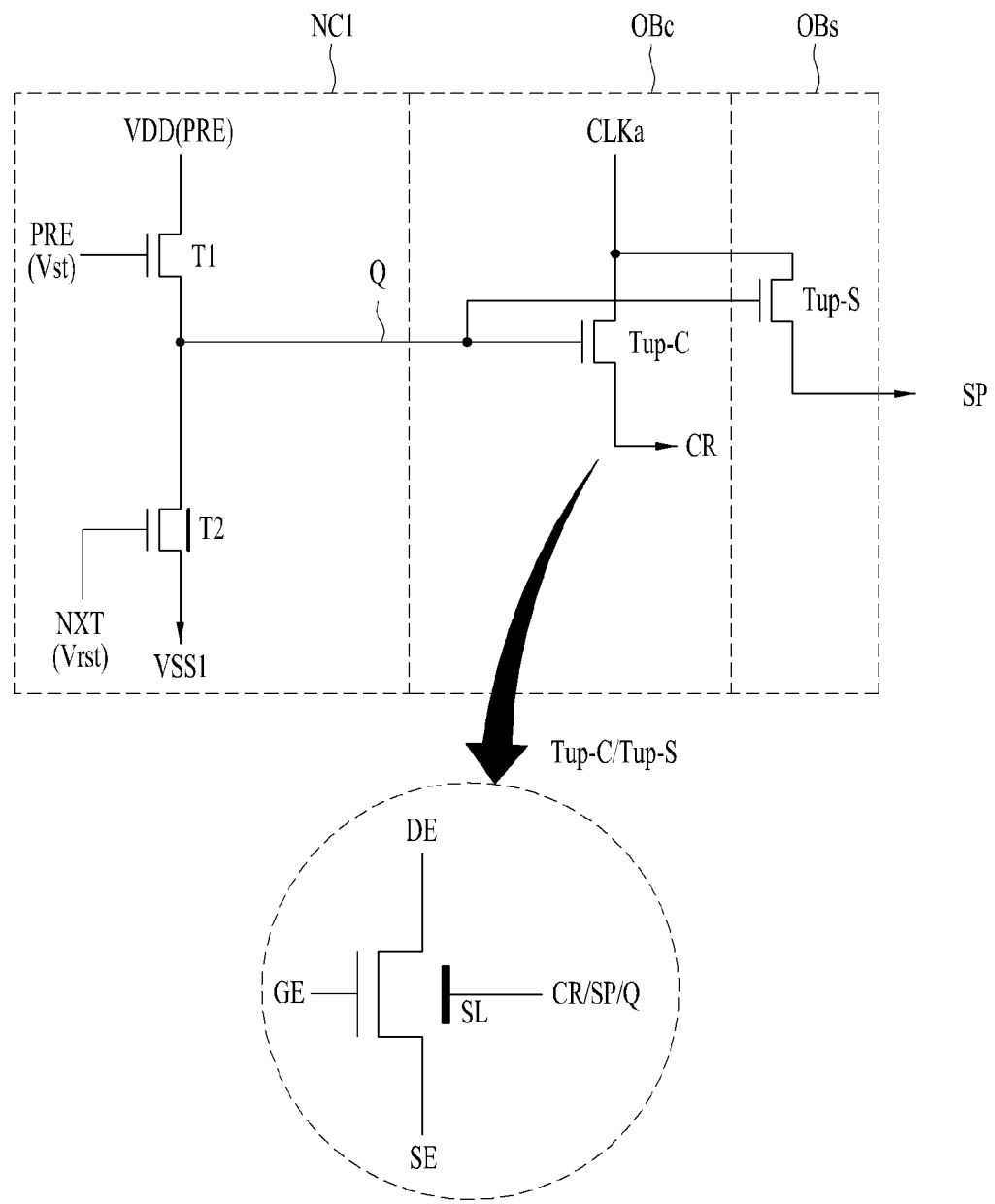
FIG. 11 is a circuit diagram illustrating one stage of a shift register in accordance with still another embodiment of the present invention.

FIG. 11 is a circuit diagram illustrating any one stage of a shift register in accordance with still another embodiment of the present invention.

The embodiment shown in FIG. 11 differs from the former embodiment shown in FIG. 7 in that a carry output unit OBc controlled by a first node Q is additionally provided. Thus, an output unit is divided into a scan output unit OBs and the carry output unit OBc.

The scan output unit OBs includes a pull-up transistor for scanning Tup-S to output a clock pulse CLKa as a scan pulse SP in response to control of the first node Q. The carry output unit OBc includes a pull-up transistor for carrying Tup-C to output a clock pulse CLKa as a carry signal CR in response to control of the first node Q. The carry signal CR output from the carry output unit OBc is supplied as previous output PRE to the next stage and supplied as next output NXT to the previous stage. Thereby, an output node of the carry signal CR and an output node of the scan signal SP are divided from each other. Thus, a load of the carry signal CR is decreased and delay of the carry signal CR for controlling charge and discharge of the previous and next stages is reduced.

At least one of a plurality of transistors T1, T2, Tup-C and Tup-S shown in FIG. 11 is formed as a light-shielding transistor additionally including a light-shielding layer.

For example, among the transistors T1, T2, Tup-C and Tup-S shown in FIG. 11, at least the second transistor T2 for controlling discharge of the first node Q may be formed as a light-shielding transistor and, in addition, the pull-up transistor for carrying Tup-C or the pull-up transistor for scanning Tup-S may be formed as a light-shielding transistor.

If the pull-up transistor for carrying Tup-C or the pull-up transistor for scanning Tup-S is formed as a light-shielding transistor, a carry signal CR or a scan signal SP may be applied to the light shielding layer thereof or the voltage of the first node Q may be applied to the light-shielding layer thereof. Thereby, the threshold voltage of the pull-up transistor for carrying Tup-C or the pull-up transistor for scanning Tup-S may be adjusted to have a positive value by the voltage applied to the light-shielding layer thereof. Thus, output stability may be improved.

Figure 12:
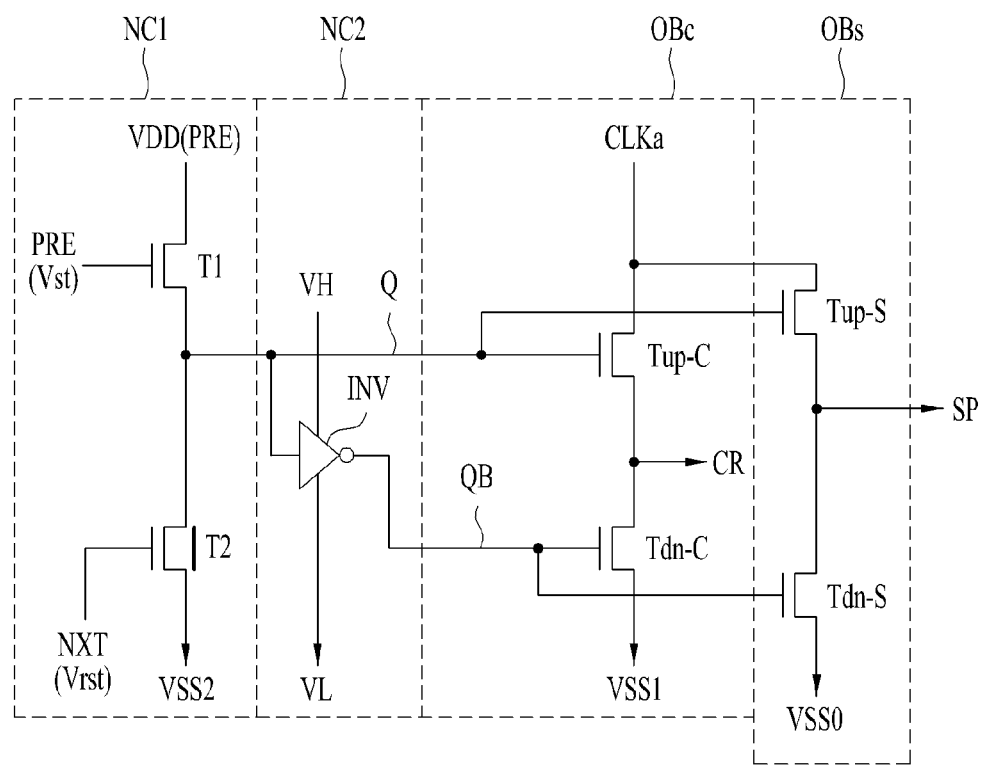
FIG. 12 is a circuit diagram illustrating one stage of a shift register in accordance with yet another embodiment of the present invention.

FIG. 12 is a circuit diagram illustrating any one stage of a shift register in accordance with yet another embodiment of the present invention.

As compared to the embodiment shown in FIG. 11, in the embodiment shown in FIG. 12, the carry output unit OBc further includes a pull-down transistor for carrying Tdn-C controlled by a second node QB, and the scan output unit OBs further includes a pull-down transistor for scanning Tdn-S controlled by the second node QB. In addition, the stage shown in FIG. 12 includes a second node controller NC2 including an inverter INV connected between the first node Q and the second node QB.

The pull-down transistor for scanning Tdn-S of the scan output unit OBs supplies first low voltage VSS0 as first gate off voltage of the scan signal SP in response to control of the second node QB.

The pull-down transistor for carrying Tdn-C of the carry output unit OBc supplies second low voltage VSS1 as second gate off voltage of the carry signal CR in response to control of the second node QB. The carry signal CR output from the carry output unit OBc is supplied as previous output PRE of the next stage and supplied as next output NXT of the previous stage. A second transistor T2, which is a reset part of a first node controller NC1, discharges the first node Q by third low voltage VSS2, i.e., reset voltage, in response to a next carry signal CRn.

An inverter INV of the second node controller NC2 supplies high voltage VH or low voltage VL, which is in an opposite logic state to a logic state of the first node Q, to the second node QB in response to control of the first node Q.

The high voltages VDD and VH may be the same or may be different. The low voltages VSS0, VSS1, VSS2 and VL may be the same or be different.

At least one of a plurality of transistors shown in FIG. 12 may be formed as a light-shielding transistor additionally including a light-shielding layer.

For example, in FIG. 12, the second transistor T2 may be formed as a light-shielding transistor or the transistors connected to the low voltages VSS0, VSS1, VSS2 and VL may be formed as light-shielding transistors. Any one of VSS0, VSS1, VSS2 and VL may be applied to the light-shielding transistors or separate voltage may be applied to the light-shielding transistors.

Figure 13A:
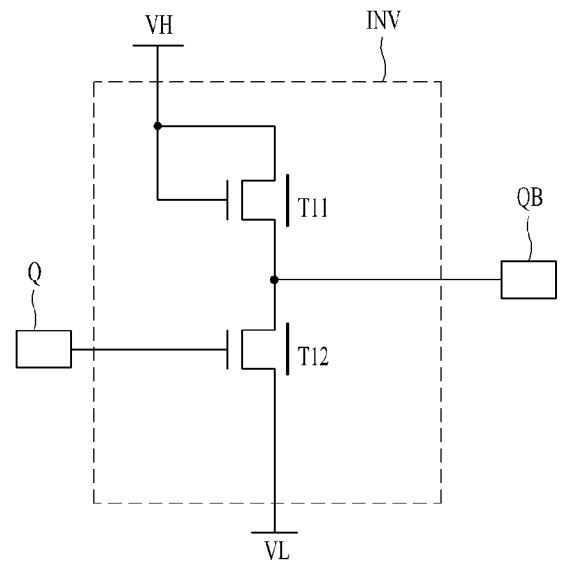
FIGS. 13A to 13C are circuit diagrams illustrating various examples of an inverter shown in FIG. 12.
Figure 13B:
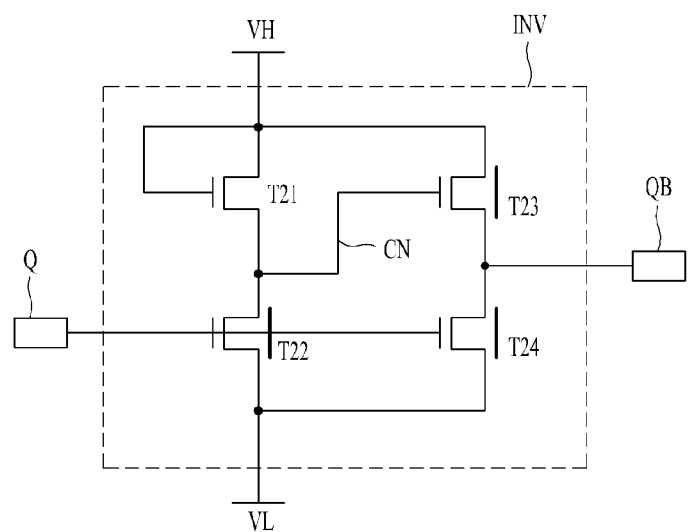
Figure 13C:
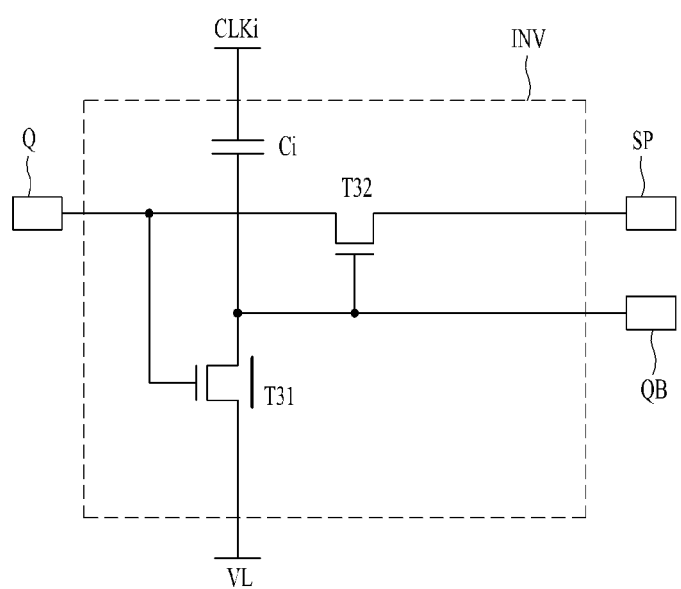

FIGS. 13A to 13C are circuit diagrams illustrating various examples of the inverter INV shown in FIG. 12.

An inverter INV in accordance with one embodiment shown in FIG. 13A includes a 1-$1^{st}$ transistor T11 having a diode structure connected between a supply line of high voltage VH and the second node QB, and a 1-$2^{nd}$ transistor T12 to supply low voltage VL to the second node QB in response to control of the first node Q.

When the 1-$2^{nd}$ transistor T12 is turned off due to the discharged state of the first node Q, the second node QB is charged with high voltage VH through the turned-on 1-$1^{st}$ transistor T11. When the 1-$2^{nd}$ transistor T12 is turned on by the charged state of the first node Q, even though the 1-$1^{st}$ transistor T11 having the diode structure is turned on, the second node QB is discharged by low voltage VL through the 1-$2^{nd}$ transistor T12. In one embodiment, the 1-$2^{nd}$ transistor T12 has more drive strength than the 1-$1^{st}$ transistor T11 (e.g., a channel width of the 1-$2^{nd}$ transistor T12 is larger than a channel width of the 1-$1^{st}$ transistor T11 for equal channel lengths).

In the inverter INV in accordance with the embodiment shown in FIG. 13A, at least one of the 1-$1^{st}$ and 1-$2^{nd}$ transistors T11 and T12 may be formed as a light-shielding transistor.

An inverter INV in accordance with another embodiment shown in FIG. 13B includes a 2-$1^{st}$ transistor T21 to a 2-$4^{th}$ transistor T24.

The 2-1$^{st}$ transistor T21 has a diode structure connected between a supply line of high voltage VH and a common node CN. The 2-2$^{nd}$ transistor T22 discharges the common node by low voltage VL in response to control of the first node Q. A 2-3$^{rd}$ transistor T23 charges a second node QB with high voltage VH in response to control of the common node CN. The 2-4$^{th}$ transistor T24 discharges the second node QB by low voltage VL in response to control of the first node Q.

When the 2-2$^{nd}$ and 2-4$^{th}$ transistors T22 and T24 are turned off by the discharged state of the first node Q1, the common node CN is charged with high voltage VH by the turned-on 2-1$^{st}$ transistor T21, and the second node QB is charged with high voltage VH through the 2-3$^{rd}$ transistor T23 turned on by control of the common node CN. When the 2-2$^{nd}$ and 2-4$^{th}$ transistors T22 and T24 are turned on by the charged state of the first node Q1, even though the 2-1$^{st}$ transistor T21 having the diode structure is turned on, the common node CN is discharged by low voltage VL through the turned-on 2-2$^{nd}$ transistor T22, the 2-3$^{rd}$ transistor T23 is turned off by control of the common node CN and the second node QB is discharged by low voltage VL through the turned-on 2-4$^{th}$ transistor T24. In one embodiment, the 2-2$^{nd}$ transistor T22 has more drive strength than the 2-1$^{st}$ transistor T21 (e.g., a channel width of the 2-2$^{nd}$ transistor T22 is larger than a channel width of the 2-1$^{st}$ transistor T21 for equal channel lengths).

In the inverter INV in accordance with the embodiment shown in FIG. 13B, the 2-2$^{nd}$, 2-3$^{rd}$ and 2-4$^{th}$ transistors T22, T23 and T24 may be formed as light-shielding transistors, or the 2-2$^{nd}$ and 2-4$^{th}$ transistors T22 and T24 connected to low voltage VL may be formed as light-shielding transistors.

An inverter INV in accordance with yet another embodiment shown in FIG. 13C includes a 3-1$^{st}$ transistor T31, a 3-2$^{nd}$ transistor T32 and a capacitor Ci.

The capacitor Ci supplies one clock signal CLKi to a second node QB. The 3-1$^{st}$ transistor T31 discharges the second node QB by low voltage VL in response to control of a first node Q. The 3-2$^{nd}$ transistor T32 connects the first node Q to an output node for outputting a scan pulse SP in response to control of the second node Qb.

In the inverter INV in accordance with the embodiment shown in FIG. 13C, the 3-1$^{st}$ transistor T31 connected to low voltage VL may be formed as a light-shielding transistor.

Figure 14:
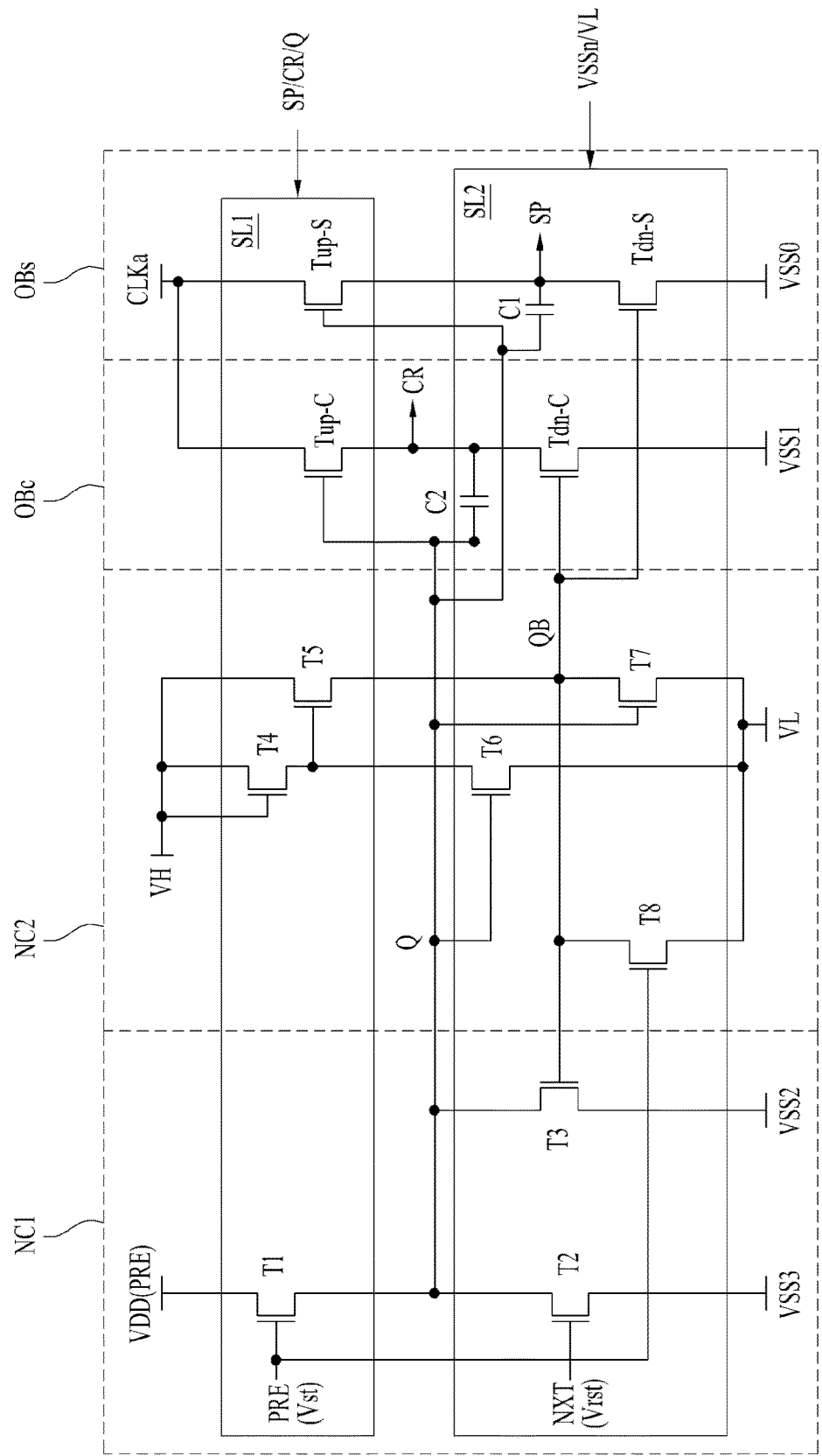
FIG. 14 is a circuit diagram illustrating one stage of a shift register in accordance with still yet another embodiment of the present invention.

FIG. 14 is a circuit diagram illustrating any one stage of a shift register in accordance with still yet another embodiment of the present invention.

As compared to the embodiment shown in FIG. 12, in the embodiment shown in FIG. 14, the first node controller NC1 additionally includes a third transistor T3 of a noise cleaner controlled by a second node QB, and the second node controller NC2 includes an inverter INV including fourth to seventh transistors T4 to T7. In addition, the stage shown in FIG. 14 includes an eighth transistor T8 controlled by previous output PRE. Third low voltage VSS2, i.e., second reset voltage, is applied to the third transistor of the noise cleaner and fourth low voltage VSS3, i.e., first reset voltage, is applied to a second transistor T2 of a reset part.

The third transistor T3 of the noise cleaner added to the first node controller NC1 discharges a first node Q by third low voltage VSS2 in response to control of the second node QB. Thereby, the third transistor T3 removes noise induced to the first node Q by coupling of a clock CLKa supplied to pull-up transistors Tup-C and Tup-S, when the first node Q is logically low. The inverter INV of the second node controller NC2 includes the fourth to seventh transistors T4 to T7 respectively corresponding to the four transistors T21 to T24 shown in FIG. 13B and supplies high voltage VH or low voltage VL to the second node QB in an opposite logic state to a logic state of the first node Q. The eighth transistor T8 added to the second node controller NC2 discharges the second node QB by low voltage VL in response to the previous output PRE.

A first capacitor C1 is formed between a gate electrode and a source electrode of the pull-up transistor for scanning Tup-S of a scan output unit OBs so as to amplify voltage of the gate electrode. A second capacitor C2 is formed between a gate electrode and a source electrode of the pull-up transistor for scanning Tup-S of a scan output unit OBs so as to amplify voltage of the gate electrode.

When the first node Q reaches a charged state due to the first node controller NC1, the pull-up transistor for scanning Tup-S and the pull-up transistor for scanning Tup-C output the clock signal CLKa as a scan signal SP and a carry signal CR, respectively.

When the second node QB reaches a charged state due to the second node controller NC2, the pull-down transistor for resetting Tdn-S and the pull-down transistor for resetting Tdn-C output first and second low voltages VSS0 and VSS1 as the scan signal SP and the carry signal CR, respectively.

At least one of a plurality of transistors shown in FIG. 14 is formed as a light-shielding transistor additionally including a light-shielding layer.

For example, light-shielding layers provided in the stage shown in FIG. 14 may be divided into a first light-shielding layer SL1 overlapping transistors for charging T1, T4, T5, Tup-C and Tup-S, and a second light-shielding layer SL2 overlapping transistors for discharging T2, T3, T6 to T8, Tdn-C and Tdn-S. Any one of the first light-shielding layer SL1 and the second light-shielding layer SL2 may be provided. Any one of the scan signal SP, the carry signal CR and voltage of the first node Q may be applied to the first light-shielding layer SL1 overlapping the transistors T1, T4, T5, Tup-C and Tup-S for charging. Any one of low voltages VSS0, VSS1, VSS2, VSS3 and VL may be applied to the second light-shielding layer SL2 overlapping the transistors T2, T3, T6 to T8, Tdn-C and Tdn-S for discharging.

Figure 15:
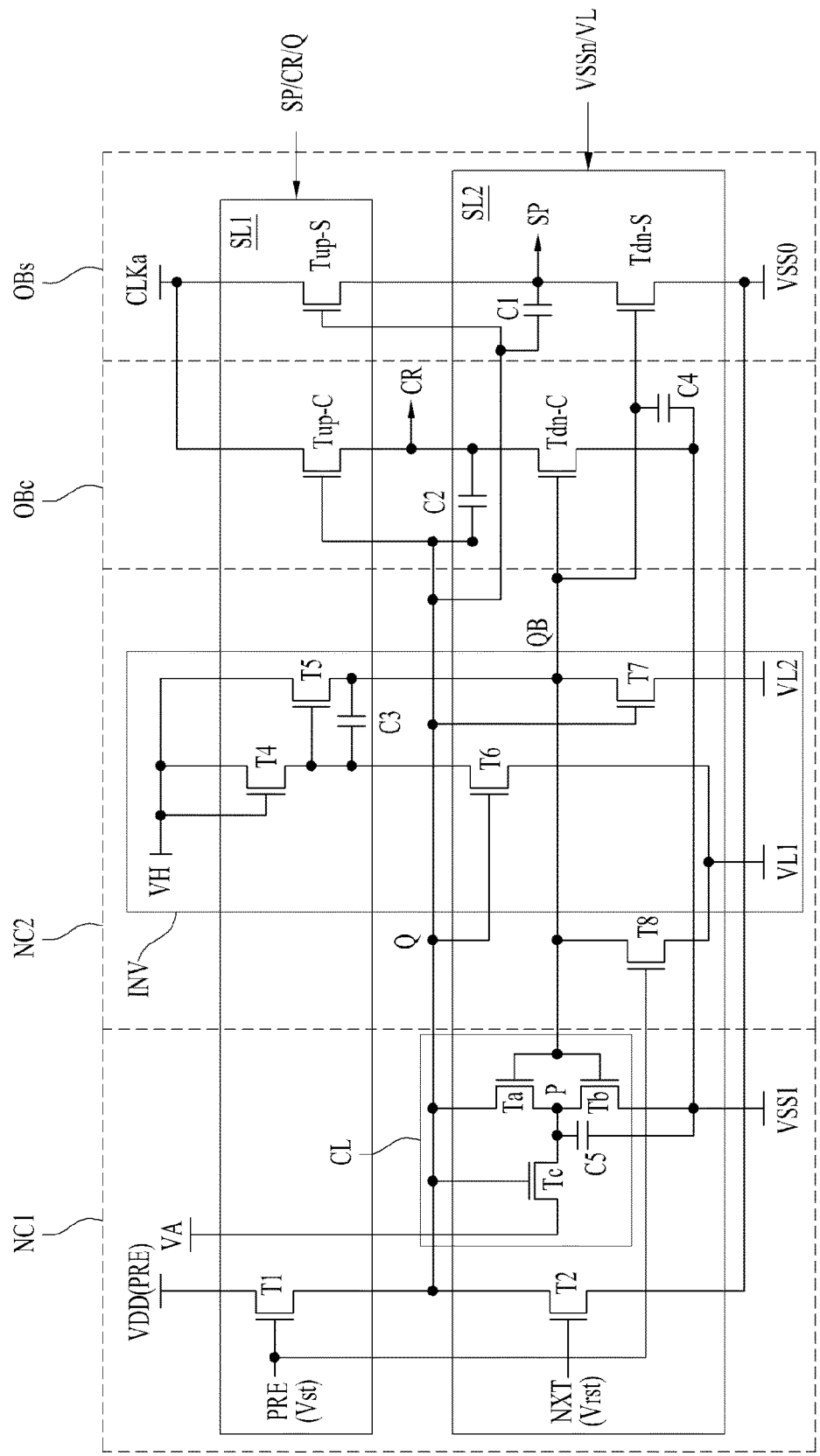
FIG. 15 is a circuit diagram illustrating one stage of a shift register in accordance with a further embodiment of the present invention.

FIG. 15 is a circuit diagram illustrating any one stage of a shift register in accordance with a further embodiment of the present invention.

The stage in accordance with the embodiment shown in FIG. 15 differs from the stage in accordance with the embodiment shown in FIG. 14 in that a reset part of a first node controller NC1 includes a noise cleaner CL having a transistor-transistor offset (hereinafter, referred to as "TTO") structure including three transistors Ta, Tb and Tc, instead of the third transistor T3 of FIG. 14.

Further, the stage in accordance with the embodiment shown in FIG. 15 differs from the stage in accordance with the embodiment shown in FIG. 14 in that first low voltage VSS0 is supplied to a second transistor T2 of the reset part in the same manner as a pull-down transistor for scanning Tdn-S, second low voltage VSS1 is supplied to the noise cleaner CL in the same manner as a pull-down transistor for carrying Tdn-C, and a plurality of low voltages VL1 and VL2 are supplied to an inverter INV.

The noise cleaner CL is connected in series between the first node Q and a supply line of the second low voltage VSS1, and includes first and second transistors Ta and Tb to reset the first node Q to the second low voltage VSS1 in response to the logic state of a second node QB and a third transistor Tc to supply high offset voltage VA to a connection node P coupled between the first and second transistors Ta and Tb in response to the logic state of the first node Q.

The first and second transistors Ta and Tb of the noise cleaner CL are turned off when the second node QB is logically low and turned on when the second node QB is logically high, thus discharge the first node Q by the second low voltage VSS1 and reset the first node Q.

When the first and second transistors Ta and Tb of the noise cleaner CL are turned off by the low logic state of the second node QB, the third transistor Tc is turned on by the high logic state of the first node Q. The turned-on third transistor Tc applies high offset voltage VA to the connection node P coupled between the first and second transistors Ta and Tb, e.g., a source of the first transistor Ta connected to a drain of the second transistor Tb. Because low voltage VL2 of the second node QB is applied to a gate of the first transistor Ta and high offset voltage VA higher than the low voltage VL2 is applied to the source of the first transistor Ta, gate-source voltage Vgs has a negative value lower than a threshold voltage. Thus, the first transistor Ta is completely turned off. Even if the threshold voltage of the first transistor Ta is moved in the direction of a negative value, the gate-source voltage Vgs is lower than the threshold voltage because of the high offset voltage VA applied to the source of the first transistor Ta. Thus, the first transistor Ta can be completely turned off. Thereby, leakage current of the first node Q through the first and second transistors Ta and Tb may be prevented.

The high offset voltage VA may be replaced with high voltage VDD, VH, or another DC voltage.

When the first node Q is logically low, sixth and seventh transistors T6 and T7 are turned off and fourth and fifth transistors T4 and T5 are turned on. Thus, an inverter INV charges the second node QB with high voltage VH.

When the first node Q is logically high, the sixth and seventh transistors T6 and T7 are turned on and the fifth transistor is turned off. Thus, the inverter INV discharges the second node QB by low voltage VL2.

The first low voltage VSS0 may be the same as or higher than the second low voltage VSS1. The second low voltage VSS1 may be the same as or higher than the second low voltage VL2 of the inverter INV. In the inverter INV, the second low voltage VL2 may be the same as or higher than the first low voltage VL1.

For example, if the first low voltage VSS0 is higher than the second low voltage VSS1 (VSS1<VSS0), when the second transistor T2 of the reset part is turned off in response to the second low voltage VSS1 which is the low logic state of a next carry signal CRn, the gate-source voltage Vgs (Vgs=VSS1−VSS0) of the second transistor T2 becomes negative lower than the threshold voltage, the second transistor T2 is completely turned off. Thus, leakage current of the first node Q may be prevented even if the threshold voltage shifts to a negative value due to degradation. If the second low voltage VSS1 (VSS1<VSS0) is higher than the second low voltage VL2 (VL2<VSS1<VSS0) of the inverter INV applied to the second node QB, the transistors Tdn-C and Tdn-S controlled by the second node QB are completely turned off. Thus, current leakage of the output terminals thereof may be prevented.

Further, in the stage in accordance with the embodiment shown in FIG. 15, the pull-up transistor for scanning Tup-S, the pull-up transistor for carrying Tup-C and the fifth transistor T5 of the inverter INV are coupled to capacitors C1, C2 and C3 connected between gates and sources thereof, respectively, so as to bootstrap the gates thereof according to high logic states applied to drains thereof. Capacitors C4 and C5 may be further provided between the second node QB and a terminal for second low voltage VSS1 and between the connection node P of the noise cleaner CL and the terminal for second low voltage VSS1, respectively, thereby stably maintaining voltages of the second node QB and the connection node P. Various embodiments of the present invention may include at least one of the above-described capacitors C1 to C5.

At least one of a plurality of transistors shown in FIG. 15 may be formed as a light-shielding transistor additionally including a light-shielding layer.

For example, light-shielding layers provided on the stage shown in FIG. 15 may be divided into a first light-shielding layer SL1 overlapping transistors for charging T1, T4, T5, Tup-C and Tup-S for charging, and a second light-shielding layer SL2 overlapping transistors T2, T3, Ta to Tc, T6 to T8, Tdn-C and Tdn-S for discharging. Otherwise, any one of the first light-shielding layer SL1 and the second light-shielding layer SL2 may be provided. Any one of the scan signal SP, the carry signal CR and voltage of the first node Q may be applied to the first light-shielding layer SL1 overlapping the transistors T1, T4, T5, Tup-C and Tup-S for charging. Any one of low voltages VSS0, VSS1, VL1 and VL2 may be applied to the second light-shielding layer SL2 overlapping the transistors T2, T3, Ta to Tc, T6 to T8, Tdn-C and Tdn-S for discharging. Each stage may include a first light-shielding layer SL1 overlapping pull-up transistors Tup-C and Tup-S and a second light-shielding layer SL2 overlapping remaining transistors. Any one of the scan signal SP, the carry signal CR and voltage of the first node Q may be applied to the first light-shielding layer SL1 and any one of low voltages VSS0, VSS1, VL1 and VL2 may be applied to the second light-shielding layer SL2.

Figure 16:
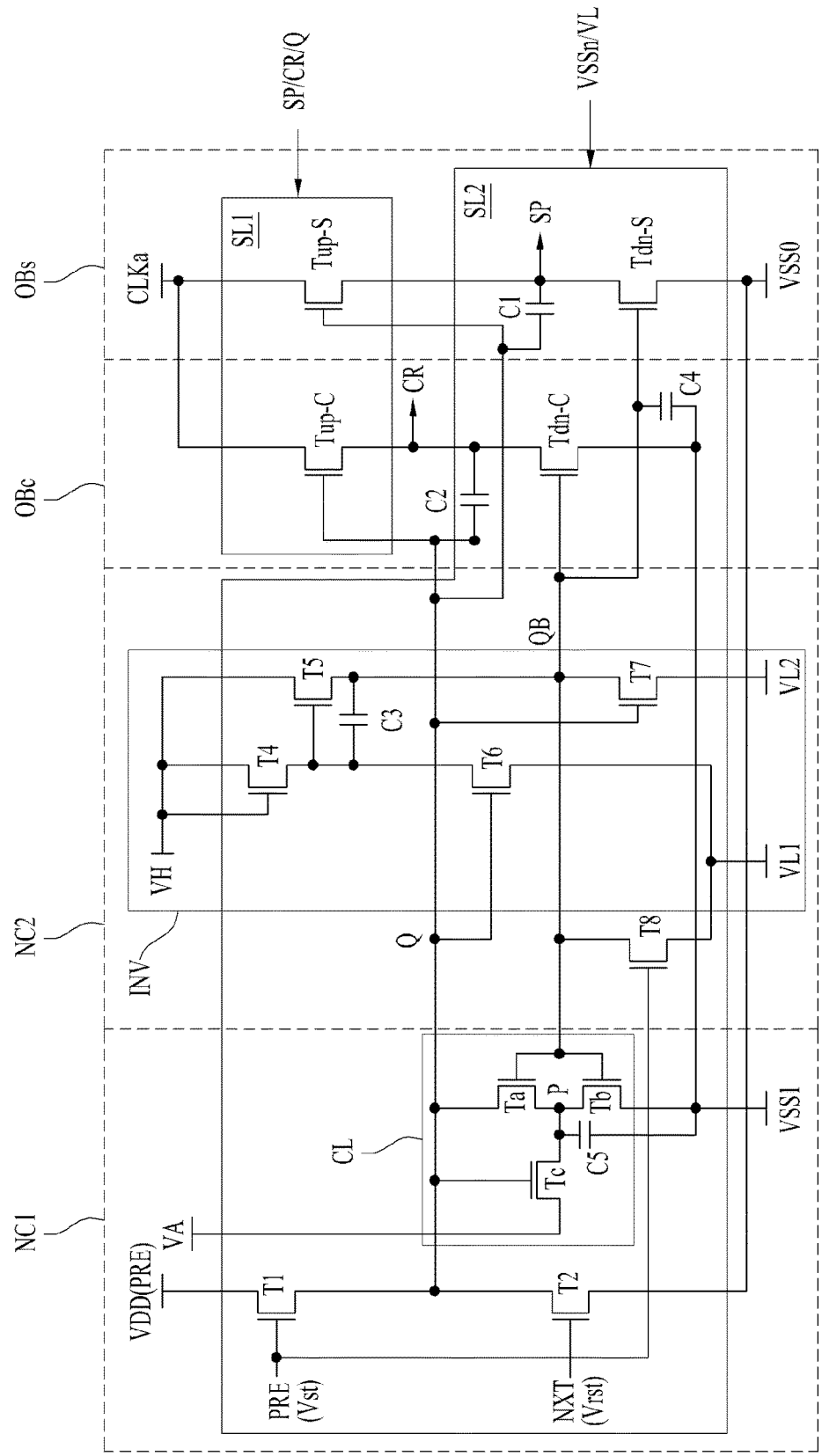
FIG. 16 is a circuit diagram illustrating one stage of a shift register in accordance with yet a further embodiment of the present invention.

Alternatively, the first light-shielding layer SL1 described with reference to FIGS. 14 to 16 may overlap at least one of the above-described transistors T1, T4, T5, Tup-C and Tup-S for charging. The above-described second light-shielding layer SL2 may overlap at least one of the above-described transistors T2, T3, Ta to Tc, T6 to T8, Tdn-C and Tdn-S for discharging. At least one of the transistors, which do not overlap the first light-shielding layer SL1 and the second light-shielding layer SL2, may overlap a third light-shielding layer (not shown) in a floating state in which no voltage is applied. For example, the third light-shielding layer in the floating state may overlap the pull-up transistor for scanning Tup-S of the scan output unit OBs.

The first light-shielding layer SL1 may be connected to first light-shielding layers SL1 belonging to some other stages.

The third light-shielding layer may be connected directly to third light-shielding layers covering other stages or connected to the third light-shielding layers through other conductive layers.

As apparent from the above description, a shift register using an oxide transistor and a display device using the same in accordance with the present invention include a light-shielding layer formed at at least a part of the region of the shift register and prevents current leakage and degradation, generated due to external light or internal light, based on light-shielding effects of transistors, thereby increasing output stability of the shift register. Further, voltage is applied to at least a part of the light-shielding layer or the light-shielding layer is divided into a plurality of regions so that different voltages are applied to the divided regions. Thus, leakage current may be reduced or prevented by adjusting threshold voltage to have a positive value due to the field effects of the light-shielding layer to which voltage is applied, for each region.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register comprising a plurality of stages, a stage of the plurality of stages comprising:
   a first node controller including a plurality of transistors configured to control charging or discharging of a first node;
   a second node controller configured to control charging or discharging of a second node;
   an output unit configured to output a clock signal as a scan signal in response to a first voltage at the first node and output a gate off voltage as the scan signal in response to a second voltage at the second node; and
   light-shielding layers overlapping transistors of the first node controller, the second node controller, and the output unit to block light,
   wherein the light-shielding layers includes at least a first light-shielding layer and a second light-shielding layer each overlapping different transistors in the stage, and
   wherein different voltages are applied to the first and second light-shielding layers.

2. The shift register of claim 1, wherein at least one of the light-shielding layers extends across two or more stages of the plurality of stages.

3. The shift register according to claim 1, wherein the output unit includes a scan output unit, the scan output unit comprising:
   a first pull-up transistor coupled to an output of the scan output unit, the first pull-up transistor configured to output the clock signal as the scan signal to a gate line of a display panel in response to the first voltage, and
   a first pull-down transistor coupled to the output of the scan output unit, the first pull-down transistor configured to output the gate off voltage as the scan signal to the gate line of the display panel in response to the second voltage.

4. The shift register according to claim 3, wherein the scan output unit is configured to output the scan signal to a preceding stage or a subsequent stage.

5. The shift register according to claim 3, wherein the output unit further includes a carry output unit, the carry output unit comprising:
   a second pull-up transistor coupled to an output of the carry output unit, the second pull-up transistor configured to output the clock signal as a carry signal in response to the first voltage, and
   a second pull-down transistor coupled to the output of the carry output unit, the second pull-down transistor configured to output another gate off voltage as the carry signal in response to the second voltage,
   wherein the carry signal is transmitted to a preceding stage or a subsequent stage.

6. The shift register according to claim 5,
   wherein the other gate off voltage is lower than the gate off voltage.

7. The shift register according to claim 1,
   wherein the second node controller includes an inverter coupled between the first node and the second node, the inverter configured to place the second node at a logic state opposite to a logic state of the first node,
   wherein the first node controller includes:
      a first transistor coupled to the first node, the first transistor configured to charge the first node with a set voltage in response to a first signal applied to a first control terminal of the first transistor,
      a second transistor coupled to the first node, the second transistor configured to discharge the first node in response to a second signal applied to a second control terminal of the second transistor, and
      a third transistor coupled to the first node, the third transistor configured to discharge the first node in response to the logic state of the second node.

8. The shift register according to claim 7,
   wherein the first signal applied to the first control terminal of the first transistor is one of a start pulse, a previous scan signal, a carry signal, and an output from a previous stage,
   wherein the second signal applied to the second control terminal of the second transistor is one of a reset pulse, a next scan signal, the carry signal, and an output from a subsequent stage, and
   wherein the set voltage is one of a supply voltage, the previous scan signal, and the carry signal.

9. The shift register according to claim 7, wherein the inverter includes:
   a first inverter supply voltage terminal,
   a second inverter supply voltage terminal, a voltage of the second inverter supply voltage terminal lower than a voltage of the first inverter supply voltage terminal,
   a first inverter pull up transistor, a gate electrode and a drain electrode of the first inverter pull up transistor coupled to the first inverter supply voltage terminal, a source electrode of the first inverter pull up transistor coupled to the second node, and
   a first inverter pull down transistor, a gate electrode of the first inverter pull down transistor coupled to the first node, a source electrode of the first inverter pull down transistor coupled to the second inverter supply voltage terminal, a drain electrode of the first inverter pull down transistor coupled to the second node.

10. The shift register according to claim 7, wherein the inverter includes:
    a first inverter supply voltage terminal,
    a second inverter supply voltage terminal, a voltage of the second inverter supply voltage terminal lower than a voltage of the first inverter supply voltage terminal,
    a first inverter pull up transistor, a gate electrode and a drain electrode of the first inverter pull up transistor coupled to the first inverter supply voltage terminal,
    a second inverter pull up transistor, a gate electrode of the second inverter pull up transistor coupled to a source electrode of the first inverter pull up transistor, a drain electrode of the second inverter pull up transistor coupled to the first inverter supply voltage terminal, a source electrode of the second inverter pull up transistor coupled to the second node,
    a first inverter pull down transistor, a gate electrode of the first inverter pull down transistor coupled to the first node, a source electrode of the first inverter pull down transistor coupled to the second inverter supply voltage terminal, a drain electrode of the first inverter pull down transistor coupled to the source electrode of the first inverter pull up transistor and the gate electrode of the second inverter pull up transistor, and
    a second inverter pull down transistor, a gate electrode of the second inverter pull down transistor coupled to the first node, a source electrode of the second inverter pull down transistor coupled to the second inverter supply voltage terminal, a drain electrode of the second inverter pull down transistor coupled to the source electrode of the second inverter pull up transistor and the second node.

11. The shift register according to claim 10, wherein a voltage of the second inverter supply voltage terminal is lower than the gate off voltage.

12. The shift register according to claim 7, wherein the first node controller includes:
a fourth transistor coupled in series with the third transistor between the first node and a supply terminal of a reset voltage, a gate electrode of the fourth transistor coupled to the second node, the third transistor and the fourth transistor to discharge the first node by the reset voltage according to the logic state of the second node, and
a fifth transistor configured to supply an offset voltage to a connection node between the third transistor and the fourth transistor according to the logic state of the first node, the offset voltage applied to the connection node through the fifth transistor higher than a voltage of the second node to turn off the third transistor responsive to the logic state of the first node to turn on the fifth transistor.

13. The shift register according to claim 7, wherein the first light-shielding layer overlaps at least one of a first pull-up transistor, a second pull-up transistor, and the transistors of the stage for controlling charge of at least one of the first and second nodes.

14. The shift register according to claim 13,
wherein the second light-shielding layer overlaps at least one of a first pull-down transistor, a second pull-down transistor, and the transistors of the stage for controlling discharge of at least one of the first and second nodes.

15. The shift register according to claim 1, wherein:
at least one of voltages of the output of the output unit and the first node is applied to the first light-shielding layer; and
at least one of a reset voltage and the gate off voltage which are applied to the second node controller is applied to the second light-shielding layer.

16. The shift register according to claim 1, wherein the transistors of the stage include an active layer formed of an oxide semiconductor.

17. The shift register according to claim 1, wherein:
the light-shielding layers further includes a third light-shielding layer which is in a floating state, and the third light-shielding layer overlaps at least one transistor of the stage, not overlapping the first light-shielding layer and the second light-shielding layer.

18. The shift register according to claim 17, wherein the third light-shielding layer overlaps a pull-up transistor of the output unit.

19. The shift register of claim 1, wherein at least one of the different voltages is at least one of the voltages applied to the transistor or separate voltage supplied externally.

* * * * *